US011984415B2

United States Patent
Park et al.

(10) Patent No.: US 11,984,415 B2
(45) Date of Patent: May 14, 2024

(54) INTERPOSER, METHOD FOR FABRICATING THE SAME, AND SEMICONDUCTOR PACKAGE HAVING THE SAME

(71) Applicant: Samsung Electronics Co., Ltd., Suwon-si (KR)

(72) Inventors: Yukyung Park, Hwaseong-si (KR); Ungcheon Kim, Cheonan-si (KR); Wonil Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 143 days.

(21) Appl. No.: 17/528,954

(22) Filed: Nov. 17, 2021

(65) Prior Publication Data

US 2022/0302053 A1    Sep. 22, 2022

(30) Foreign Application Priority Data

Mar. 17, 2021  (KR) .................. 10-2021-0034855

(51) Int. Cl.
*H01L 23/498* (2006.01)
*H01L 21/48* (2006.01)
(Continued)

(52) U.S. Cl.
CPC ............ *H01L 24/02* (2013.01); *H01L 21/486* (2013.01); *H01L 23/49838* (2013.01);
(Continued)

(58) Field of Classification Search
CPC .. H01L 24/94; H01L 23/841; H01L 23/49838
See application file for complete search history.

(56) References Cited

U.S. PATENT DOCUMENTS 8,791,549 B2 * 7/2014 Chen ....................... H01L 24/11
257/621
8,867,869 B2 * 10/2014 Steijer ................. G02B 6/4259
257/E31.127

(Continued)

FOREIGN PATENT DOCUMENTS

KR    10-2001-0056822 A    7/2001
KR    10-1624851 B1    5/2016

*Primary Examiner* — Dale E Page
*Assistant Examiner* — Wilner Jean Baptiste
(74) *Attorney, Agent, or Firm* — Muir Patent Law, PLLC

(57) ABSTRACT

An interposer according to an embodiment of the present invention includes a base layer having opposite first and second surfaces, a wiring structure on the first surface of the base layer, an interposer protective layer disposed on the second surface of the base layer and having a pad recess with a lower surface of the interposer protective layer positioned at a first vertical level and a bottom surface of the pad recess positioned at a second vertical level that is higher than the first vertical level, an interposer pad of which a portion fills the pad recess of the interposer protective layer and the remaining portion protrudes from the interposer protective layer, and an interposer through electrode extending through the base layer and the interposer protective layer to the interposer pad, the interposer through electrode electrically connecting the wiring structure to the interposer pad.

20 Claims, 17 Drawing Sheets

(51) Int. Cl.
    *H01L 23/00*     (2006.01)
    *H01L 23/544*     (2006.01)
    *H01L 25/10*     (2006.01)
    *H01L 25/18*     (2023.01)
    *H01L 23/48*     (2006.01)

(52) U.S. Cl.
CPC ............ H01L 23/544 (2013.01); H01L 24/03 (2013.01); H01L 24/05 (2013.01); H01L 24/06 (2013.01); H01L 25/105 (2013.01); H01L 25/18 (2013.01); *H01L 23/481* (2013.01); *H01L 23/49816* (2013.01); *H01L 23/49827* (2013.01); *H01L 24/04* (2013.01); *H01L 2223/54426* (2013.01); *H01L 2224/0213* (2013.01); *H01L 2224/02141* (2013.01); *H01L 2224/02145* (2013.01); *H01L 2224/0215* (2013.01); *H01L 2224/03019* (2013.01); *H01L 2224/03462* (2013.01); *H01L 2224/0401* (2013.01); *H01L 2224/05019* (2013.01); *H01L 2224/05025* (2013.01); *H01L 2224/05082* (2013.01); *H01L 2224/0603* (2013.01); *H01L 2224/06182* (2013.01)

(56) References Cited

U.S. PATENT DOCUMENTS

| | | |
|---|---|---|
| 8,872,345 B2 | 10/2014 | Hsieh et al. |
| 9,236,349 B2 | 1/2016 | Lee et al. |
| 9,343,361 B2 | 5/2016 | Lee et al. |
| 9,449,913 B2 | 9/2016 | Lee et al. |
| 9,978,708 B2 | 5/2018 | Chen et al. |
| 10,002,836 B2 | 6/2018 | Spitzlsperger et al. |
| 10,699,915 B2 | 6/2020 | Lee et al. |

\* cited by examiner

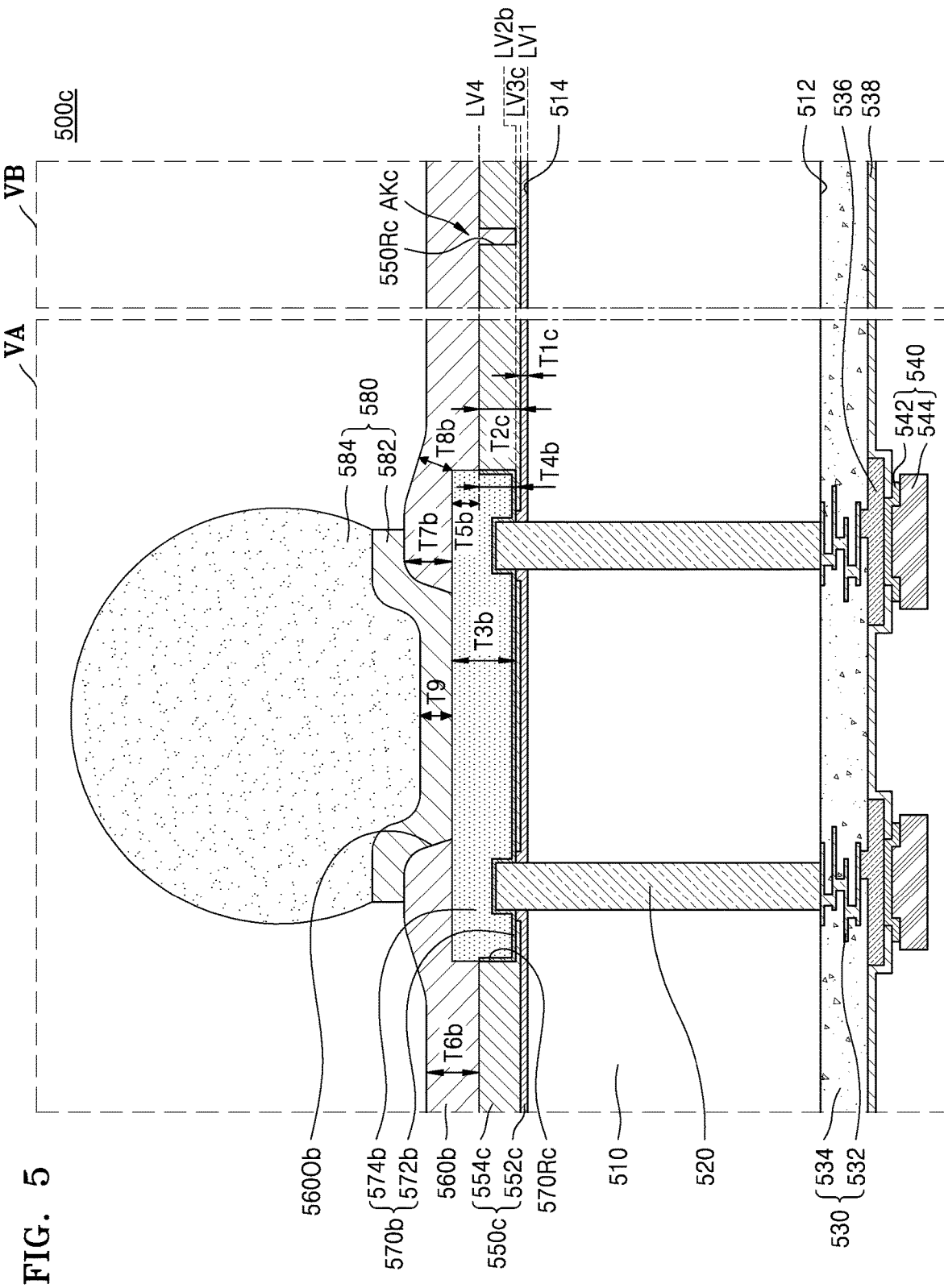

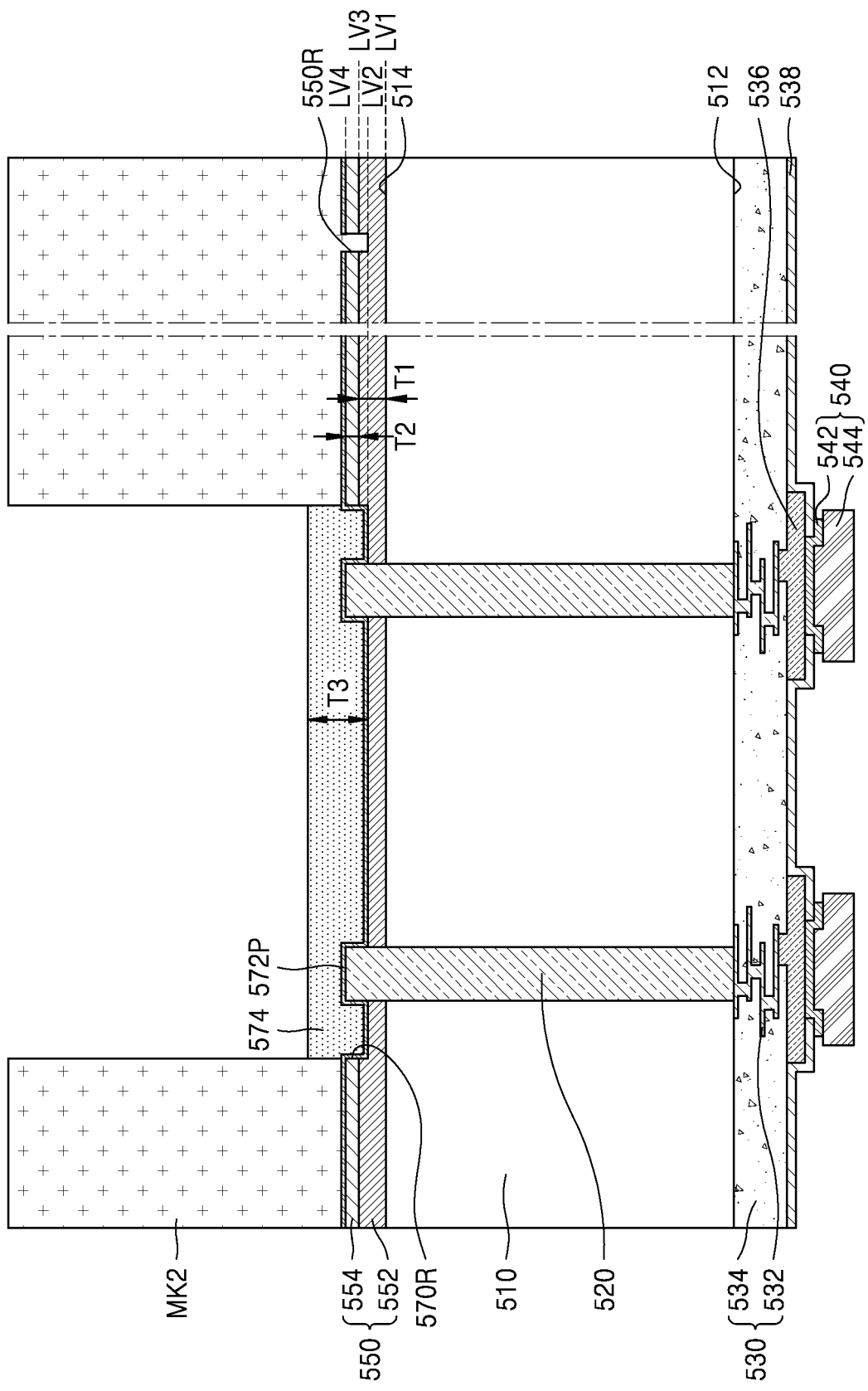

INTERPOSER, METHOD FOR FABRICATING THE SAME, AND SEMICONDUCTOR PACKAGE HAVING THE SAME

CROSS-REFERENCE TO RELATED APPLICATION

This application is based on and claims priority under 35 U.S.C. § 119 to Korean Patent Application No. 10-2021-0034855, filed on Mar. 17, 2021, in the Korean Intellectual Property Office, the disclosure of which is incorporated by reference herein in its entirety.

BACKGROUND

The present disclosure relates to an interposer electrically connecting a semiconductor chip to a main board, a method of manufacturing the interposer, and a semiconductor package having the interposer.

As miniaturization, multifunctionality, and high performance of electronic products are required, light and thin, high integration, high performance, and high speed of semiconductor packages are also required. Accordingly, the demand for a semiconductor package capable of implementing a system having a high memory bandwidth is increasing. Because the memory bandwidth is proportional to the data transmission speed and the number of data transmission lines, the memory bandwidth may be increased by increasing the memory operation speed or increasing the number of data transmission lines. Accordingly, in order to increase the number and density of connection bumps attached to connection pads of a semiconductor chip, a semiconductor package using an interposer has been introduced.

SUMMARY

Embodiments of the present invention provides an interposer capable of increasing a memory bandwidth and a semiconductor package having the interposer.

In order to solve the above technical problem, embodiments of the present invention provides the following interposer, and a semiconductor package having the same.

An interposer according to an embodiment of the present invention includes: a base layer having opposite first and second surfaces; a wiring structure on the first surface of the base layer; an interposer protective layer disposed on the second surface of the base layer and having a pad recess with a lower surface of the interposer protective layer positioned at a first vertical level and a bottom surface of the pad recess positioned at a second vertical level that is higher than the first vertical level; an interposer pad of which a portion fills the pad recess of the interposer protective layer and the remaining portion protrudes from the interposer protective layer; and an interposer through electrode extending through the base layer and the interposer protective layer to the interposer pad, the interposer through electrode electrically connecting the wiring structure to the interposer pad.

An interposer according to an embodiment of the present invention includes: a base layer having opposite first and second surfaces; a wiring structure on the first surface of the base layer; a lower interposer protective layer formed on the second surface of the base layer; an upper interposer protective layer formed on the lower interposer protective layer; an interposer pad of which a first portion filling a pad recess extending from an upper surface of the upper interposer protective layer into the lower interposer protective layer and a second portion protruding from the upper interposer protective layer are integrally formed; an interposer through electrode extending through the base layer and the lower interposer protective layer to the interposer pad up to the same vertical level as an upper surface of the upper interposer protective layer, the interposer through electrode electrically connecting the wiring structure to the interposer pad; and an alignment key penetrating the upper interposer protective layer and extending into the lower interposer protective layer.

A semiconductor package according to an embodiment of the present invention includes: an interposer including a base layer having a first surface and a second surface opposite to each other, a wiring conductive layer disposed on the first surface of the base layer, an inter-wiring insulating layer disposed on the first surface of the base layer and surrounding the wiring conductive layer, a plurality of micro pads electrically connected to the wiring conductive layer, an interposer protective layer covering the second surface of the base layer, a plurality of interposer pads each including a first portion disposed below a top surface of the interposer protective layer and a second portion protruding from the interposer protective layer, and a plurality of interposer through electrodes electrically connecting the wiring conductive layer to the plurality of interposer pads; at least one sub-semiconductor package mounted on the first surface of the base layer to be electrically connected to some of the plurality of micro-pads, and including a first semiconductor chip and a plurality of second semiconductor chips sequentially stacked; and a third semiconductor chip spaced apart from the at least one sub-semiconductor package in a horizontal direction and mounted on the first surface of the base layer to be electrically connected to some other of the plurality of micro-pads.

An interposer manufacturing method according to an embodiment of the present invention includes: preparing a base layer having a first surface and a second surface opposite to each other, and an interposer through electrode penetrating the base layer and protruding from the second surface of the base layer; forming an interposer protective layer covering the second surface of the base layer and having an upper surface at the same vertical level as an upper surface of the interposer through electrode; removing a portion of the interposer protective layer to form a pad recess in which an upper portion of the interposer through electrode is exposed and a portion of the interposer protective layer is exposed on a bottom surface; forming an interposer pad filling the pad recess of the interposer protective layer and protruding from the interposer protective layer; and forming a rear wiring protective layer having a terminal opening exposing a portion of the interposer pad and covering the remaining portion of the interposer pad and the interposer protective layer.

BRIEF DESCRIPTION OF THE DRAWINGS

Embodiments of the inventive concept will be more clearly understood from the following detailed description taken in conjunction with the accompanying drawings in which:

FIG. 5 is an enlarged cross-sectional view illustrating portions of an interposer according to an embodiment of the present invention;

FIGS. 6A to 6G are cross-sectional views illustrating a method of manufacturing an interposer according to an embodiment of the present invention in stages;

DETAILED DESCRIPTION OF THE EMBODIMENTS

Figure 1:
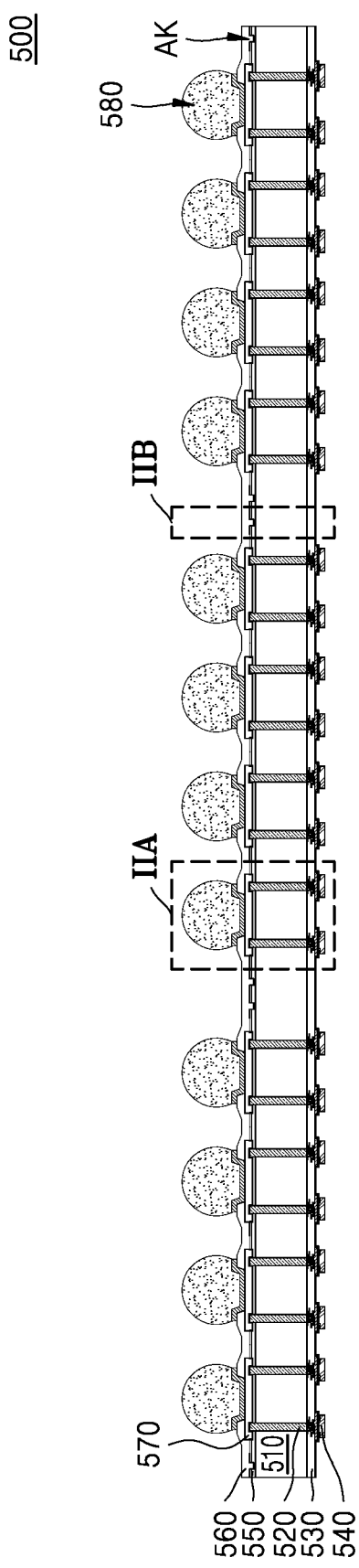
FIG. 1 is a cross-sectional view showing an interposer according to an embodiment of the present invention.

FIG. 1 is a cross-sectional view showing an interposer according to an embodiment of the present invention.

Referring to FIG. 1, an interposer 500 includes a base layer 510, a plurality of interposer through electrodes 520 penetrating the base layer 510 from a first surface 512 to a second surface 514 of the base layer 510, a wiring structure 530 disposed on the first surface 512 of the base layer 510, a plurality of micro pads 540 on the first surface 512 of the base layer 510 and electrically connected to the wiring structure 530, an interposer protective layer 550 covering the second surface 514 of the base layer 510, a plurality of interposer pads 570 partially buried in the interposer protective layer 550, and a rear wiring protective layer 560 covering the plurality of interposer pads 570. The interposer protective layer 550 may expose a portion of the plurality of interposer pads 570. The interposer 500 may further include a plurality of interposer connection terminals 580 respectively attached to the plurality of interposer pads 570.

As used herein, components described as being "electrically connected" are configured such that an electrical signal can be transferred from one component to the other (although such electrical signal may be attenuated in strength as it transferred and may be selectively transferred).

The base layer 510 may include or be formed of a semiconductor material, glass, ceramic, or plastic. For example, the base layer 510 may include or be formed of silicon. In some embodiments, the base layer 510 may include or may be a silicon semiconductor substrate.

Each of the plurality of interposer through electrodes 520 may include or be formed of a conductive plug passing through the base layer 510 and a conductive barrier film surrounding the conductive plug. The conductive plug may include or be formed of Cu or W, and the conductive barrier film may include or be formed of a metal or a conductive metal nitride. The conductive plug may have a cylindrical shape, and the conductive barrier film may have a cylindrical shape surrounding a sidewall of the conductive plug. A plurality of via insulating films may be interposed between the base layer 510 and the plurality of interposer through electrodes 520 to surround sidewalls of the plurality of interposer through electrodes 520. The plurality of via insulating films may prevent contact between the base layer 510 and the plurality of interposer through electrodes 520.

The via insulating film may include or be formed of an oxide film, a nitride film, a carbon film, a polymer, or a combination thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Figure 8:
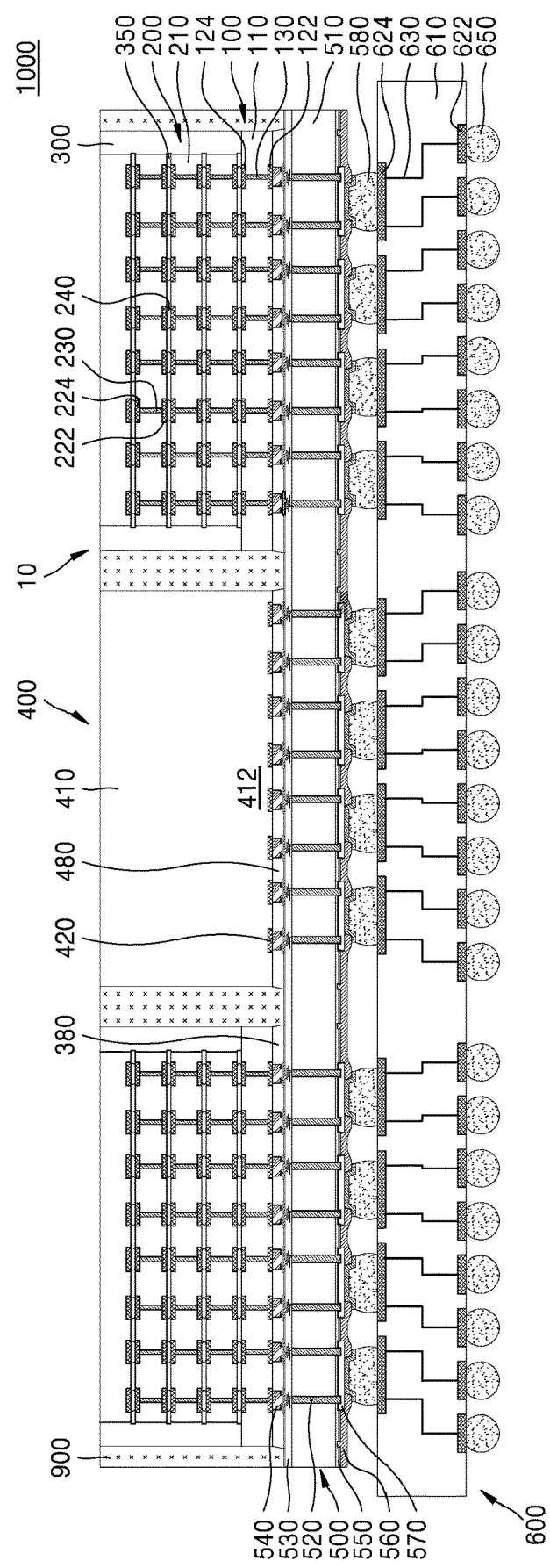
FIG. 8 is a cross-sectional view illustrating a semiconductor package having an interposer according to an embodiment of the present invention.

In FIG. 1, the first surface 512 and the second surface 514 are respectively shown as being on the lower side and the upper side of the base layer 510, and in the semiconductor package 1000 having the interposer 500 in FIG. 8, the first surface 512 and the second surface 514 may be referred to as an upper surface and a lower surface, respectively. The interposer 500 shown in FIG. 1 and the interposer 500 included in the semiconductor package 1000 shown in FIG. 8 are upside down with respect to each other.

The interposer 500 may further include an alignment key AK disposed on the second surface 514 of the base layer 510. The alignment key AK may be configured by an interface between the interposer protective layer 550 and the rear wiring protective layer 560 extending into the interposer protective layer 550.

Figure 2:
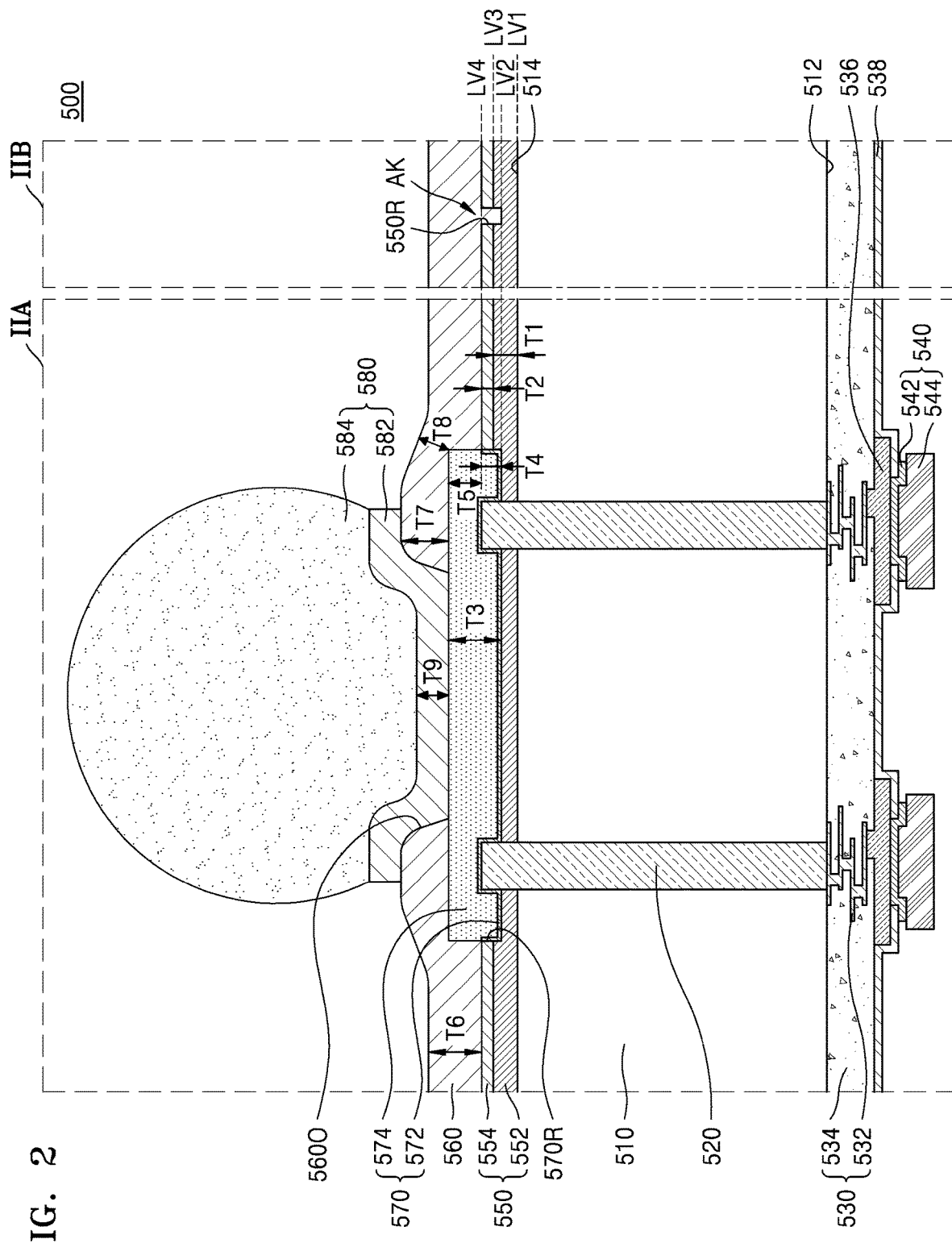
FIG. 2 is an enlarged cross-sectional view illustrating portions of an interposer according to an embodiment of the present invention.

FIG. 2 is an enlarged cross-sectional view illustrating portions of an interposer according to an embodiment of the present invention. For example, FIG. 2 is an enlarged cross-sectional view illustrating regions IIA and IIB of FIG. 1.

Referring to FIGS. 1 and 2 together, the interposer 500 may include a base layer 510, a plurality of interposer through electrodes 520, a wiring structure 530, a plurality of micro pads 540, an interposer protective layer 550, a plurality of interposer pads 570, and a rear wiring protective layer 560.

The wiring structure 530 may include a wiring conductive layer 532 and an inter-wiring insulating layer 534 surrounding the wiring conductive layer 532. The wiring conductive layer 532 may electrically connect the plurality of interposer through electrodes 520 to the plurality of micro pads 540. The wiring conductive layer 532 may include or be formed of a metal material such as aluminum, copper, or tungsten. The inter-wiring insulating layer 534 may include or be formed of silicon oxide. In some embodiments, the inter-wiring insulating layer 534 may be formed of tetraethyl orthosilicate (TEOS). In some other embodiments, the inter-wiring insulating layer 534 may be made of an insulating material having a lower dielectric constant than silicon oxide, for example, an ultra low k (ULK) film having an ultra low dielectric constant K of about 2.2 to about 2.4.

The wiring conductive layer 532 may include a plurality of wiring patterns constituting a plurality of wiring layers and a plurality of wiring vias connecting wiring patterns disposed on different wiring layers. The wiring layer may be an electrical path extending in a plane, and different wiring layers may be electrical paths horizontally extending in planes at different vertical levels, respectively.

A plurality of pad wiring patterns 536 electrically connected to the wiring conductive layer 532 and disposed on the wiring structure 530 may be between the wiring conductive layer 532 and the plurality of micro pads 540. For example, the plurality of pad wiring patterns 536 may include or be formed of copper, nickel, or a copper alloy. A front wiring protective layer 538 may expose a portion of the plurality of pad wiring patterns 536 and cover the wiring structure 530 and a portion of the plurality of pad wiring patterns 536. The front wiring protective layer 538 may include or be formed of epoxy or polyimide.

Each of the plurality of micro pads 540 may include a front under bump metallurgy (UBM) layer 542 in contact with the pad wiring pattern 536 and a chip connection terminal 544 in contact with the front UBM layer 542. The plurality of micro pads 540 may be formed of a conductive material, for example, copper (Cu), aluminum (Al), silver (Ag), tin (Tin), gold (Au), or solder, but are limited thereto.

The interposer protective layer 550 may include a lower interposer protective layer 552 covering the second surface 514 of the base layer 510 and an upper interposer protective layer 554 covering the lower interposer protective layer 552. The interposer protective layer 550 may be formed of an inorganic material. For example, the interposer protective layer 550 may be formed of silicon oxide, silicon nitride, or a stacked structure of silicon oxide and silicon nitride. For example, the lower interposer protective layer 552 may be made of oxide, and the upper interposer protective layer 554 may be made of nitride. In some embodiments, the lower interposer protective layer 552 may be made of silicon oxide, and the upper interposer protective layer 554 may be made of silicon nitride.

The interposer protective layer 550 may have a pad recess 570R formed on an upper surface of the upper interposer protective layer 550. For example, side walls of the pad recess 570R may extend from an upper surface of the upper interposer protective layer 554 toward the base layer 510. A portion of the lower interposer protective layer 552 may be exposed on the bottom surface of the pad recess 570R. The pad recess 570R may extend from the upper surface of the upper interposer protective layer 554 toward the base layer 510, but may not completely penetrate the interposer protective layer 550. In some embodiments, the pad recess 570R may penetrate the upper interposer protective layer 554, but may penetrate an upper portion of the lower interposer protective layer 552 and may not penetrate a lower portion thereof.

The lower interposer protective layer 552 and the upper interposer protective layer 554 may have a first thickness T1 and a second thickness T2 as a maximum thickness, respectively. For example, the first thickness T1 of a portion of the lower interposer protective layer 552 and the second thickness T2 of a portion of the upper interposer protective layer 554 that do not vertically overlap with the plurality of pad recesses 570R and the plurality of interposer pads 570 may be substantially constant. In some embodiments, the first thickness T1 may be greater than the second thickness T2. For example, the second thickness T2 may be about 0.5 µm to about 1.5 µm, and the first thickness T1 may be greater than the second thickness T2, but may be about 2.5 µm or less.

Terms such as "constant," "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially constant," "substantially the same," "substantially equal," or "substantially planar," may be exactly constant, the same, equal, or planar, or may be constant, the same, equal, or planar within acceptable variations that may occur, for example, due to manufacturing processes.

A lower surface of the lower interposer protective layer 552 may be at a first vertical level LV1, and a bottom surface of the pad recess 570R may be at a second vertical level LV2 that is higher than the first vertical level LV1. The upper surface of the lower interposer protective layer 552 and the lower surface of the upper interposer protective layer 554 may contact each other at a third vertical level LV3 that is higher than the second vertical level LV2. An upper surface of the upper interposer protective layer 554 may be at a fourth vertical level LV4 that is higher than the third vertical level LV3.

Each of the plurality of interposer pads 570 may include a seed layer 572 covering the bottom surface and side surfaces of the pad recess 570R, e.g., the surface of the interposer protective layer 550 exposed in the pad recess 570R, and a conductive pad layer 574 on the seed layer 572. The seed layer 572 may conformally cover the bottom surface and side surfaces of the pad recess 570R. At the side surface of the pad recess 570R, an uppermost end of the seed layer 572 may be at the fourth vertical level LV4.

Each of the plurality of interposer pads 570 may fill the pad recess 570R and protrude more outward/upward than the upper surface of the interposer protective layer 550, e.g., the upper surface of the upper interposer protective layer 554. For example, upper surfaces of the plurality of interposer pads 570 may be at a vertical level that is higher than the fourth vertical level LV4. Lower surfaces of the plurality of interposer pads 570 may be at the second vertical level LV2.

The plurality of interposer through electrodes 520 may extend into the plurality of interposer pads 570. Upper surfaces of the plurality of interposer through electrodes 520 may be at the fourth vertical level LV4. For example, the upper surface of the plurality of interposer through electrodes 520 and the upper surface of the upper interposer protective layer 554 may be at the fourth vertical level LV4. For example, the upper surface of the plurality of interposer through electrodes 520 and the upper surface of the upper interposer protective layer 554 at the same vertical level.

The lowermost surfaces of the plurality of interposer pads 570, e.g., a portion excluding the portion in contact with the plurality of interposer through electrodes 520, among the lower surfaces of the plurality of interposer pads 570 may all be in contact with the lower interposer protective layer 552. For example, the lower surfaces of the plurality of interposer pads 570 may be covered by and/or in contact with the plurality of interposer through electrodes 520 and the lower interposer protective layer 552.

Among the plurality of interposer through electrodes 520, a portion above the first vertical level LV1 at which the upper surface of the base layer 510 is positioned may be surrounded by the lower interposer protective layer 552 and the plurality of interposer pads 570. Among the plurality of interposer through electrodes 520, the upper surfaces and side surfaces of the uppermost portions among the portions above the upper surface of the base layer 510 may be surrounded by a plurality of interposer pads 570, and side surfaces of the remaining portions (e.g., the other portions) among the portions above the upper surface of the base layer 510 may be surrounded by the lower interposer protective layer 552.

Each of the plurality of interposer pads 570 may have a third thickness T3 as a maximum thickness. The third thickness T3 may be about 2 µm to about 7 µm. A portion below the fourth vertical level LV4 of the plurality of interposer pads 570, e.g., a portion buried in the interposer protective layer 550 (e.g., a portion below the top surface of the interposer protective layer 550), may have a fourth thickness T4, and another portion which is not buried in the interposer protective layer 550 and is above the fourth vertical level LV4, e.g., a portion protruding from/above the upper surface of the interposer protective layer 550 may have a fifth thickness T5. A portion buried in the interposer protective layer 550 (e.g., a portion below the top surface of the interposer protective layer 550) among the plurality of interposer pads 570 may be referred to as a first portion, and a portion of the interposer pads 570 protruding from/above the upper surface of the interposer protective layer 550 may be referred to as a second portion. The first portion and the second portion may form an integral body of an interposer pad 570. In some embodiments, the fifth thickness T5 may be greater than the fourth thickness T4. For example, the fifth thickness T5 may be greater than the fourth thickness T4, but may have a value of about 4 μm or less.

The rear wiring protective layer 560 may have a terminal opening 5600 exposing a portion of the plurality of interposer pads 570, and cover the remaining portions (e.g., the other portions) of the plurality of interposer pads 570 and the interposer protective layer 550. The rear wiring protective layer 560 may cover all side surfaces of portions of the plurality of interposer pads 570 protruding from the upper surface of the interposer protective layer 550 and cover a portion of an upper surface of the interposer pads 570, but may have a terminal opening 5600 not covering and exposing the remaining portion (e.g., the other portion) of the upper surface of the interposer pads 570. For example, the rear wiring protective layer 560 may contact portions of side surfaces of the interposer pads 570 protruding from the upper surface of the interposer protective layer 550. The rear wiring protective layer 560 may be made of an organic material. For example, the rear wiring protective layer 560 may be formed of a polymer material. In some embodiments, the rear wiring protective layer 560 may be formed of a photo imageable dielectric (PID) such as polyimide.

The rear wiring protective layer 560 may have a sixth thickness T6 on the interposer protective layer 550. For example, on the interposer protective layer 550, the lowest thickness of the rear wiring protective layer 560 may be the sixth thickness T6, and the thickness of the rear wiring protective layer 560 adjacent to the plurality of interposer pads 570 on the interposer protective layer 550 may be greater than the sixth thickness T6. The sixth thickness T6 may be greater than the fifth thickness T5. For example, the sixth thickness T6 may be about 3 μm to about 4.5 μm. The highest thickness of the rear wiring protective layer 560 on the plurality of interposer pads 570 may be a seventh thickness T7, and the lowest thickness of the rear wiring protective layer 560 on the interposer pads 570 may be an eighth thickness T8. For example, the seventh thickness T7 may be about 3 μm to about 4.5 μm, and the eighth thickness T8 may be about 1 μm to about 2.5 μm.

Each of the plurality of interposer connection terminals 580 may include a rear UBM layer 582 on the interposer pad 570, and an interposer conductive cap 584 on the rear UBM layer 582.

The rear UBM layer 582 may cover/contact a portion of the upper surface of the interposer pad 570 exposed by the terminal opening 5600 and a portion of the rear wiring protective layer 560 adjacent thereto. In some embodiments, the rear UBM layer 582 may conformally cover a portion of the upper surface of the interposer pad 570 exposed by the terminal opening 5600 and a portion of the rear wiring protective layer 560 adjacent thereto, with a ninth thickness T9. The ninth thickness T9 may be less than the seventh thickness T7. For example, the ninth thickness T9 may be about 2 μm to about 3 μm. The rear UBM layer 582 may have a concave upper surface corresponding to the terminal opening 5600.

The interposer conductive cap 584 may cover all or most of the upper surface of the rear UBM layer 582. In some embodiments, the interposer connection terminal 580 may be formed of a conductive material, for example, copper (Cu), aluminum (Al), silver (Ag), tin (Tin), gold (Au), or solder, but the present invention is not limited thereto. The interposer connection terminal 580 may include a multilayer or a single layer. In some embodiments, the interposer conductive cap 584 may be made of SnAg.

The interposer protective layer 550 may further have an alignment recess 550R extending from the upper surface of the upper interposer protective layer 554 toward the base layer 510. A portion of the lower interposer protective layer 552 may be exposed on the bottom surface of the alignment recess 550R. The alignment recess 550R may extend from the upper surface of the upper interposer protective layer 554 toward the base layer 510, but may not completely penetrate the interposer protective layer 550. In some embodiments, the alignment recess 550R may penetrate the upper interposer protective layer 554, but may penetrate only an upper portion of the lower interposer protective layer 552 and may not penetrate a lower portion thereof.

The alignment recess 550R may be filled by a rear wiring protective layer 560. The alignment recess 550R may be disposed to be spaced apart from the pad recess 570R. The alignment recess 550R may constitute/form an alignment key AK. The alignment key AK may be configured/formed by an interface between the interposer protective layer 550 and the rear wiring protective layer 560 extending into the interposer protective layer 550. For example, the alignment key AK may be formed of the bottom surface and side surface of the alignment recess 550R. For example, the alignment key AK may extend vertically and/or horizontally along the bottom surface and side surfaces of the alignment recess 550R. The bottom surface of the alignment recess 550R and the bottom surface of the pad recess 570R may be at the second vertical level LV2. For example, the bottom surface of the alignment recess 550R and the bottom surface of the pad recess 570R may be at the same vertical level.

The interposer 500 according to an embodiment of the present invention may include a plurality of interposer pads 570 that are partially buried in the interposer protective layer 550, e.g., in the pad recess 570R. Accordingly, the plurality of interposer pads 570 may be formed thickly while the height of a portion protruding from/above the interposer protective layer 550 is relatively low.

Therefore, even when the wiring conductive layer 532 constitutes a relatively large number of wiring layers and thus, the thickness of the wiring conductive layer 532 and the volume occupied by the wiring conductive layer 532 in the interposer 500 increase, the thickness of the plurality of interposer pads 570 may be increased because the height of the protruding portion of the interposer pads 570 is low, so that by adjusting the ratio of the plurality of interposer pads 570 and the wiring conductive layer 532 disposed on the upper and lower portions of the interposer 500, a warpage phenomenon may be prevented from occurring in the interposer 500. For example, the interposer pad configuration/structure of the present disclosure may be beneficial to reduce or prevent warpage of interposers.

Figure 3:
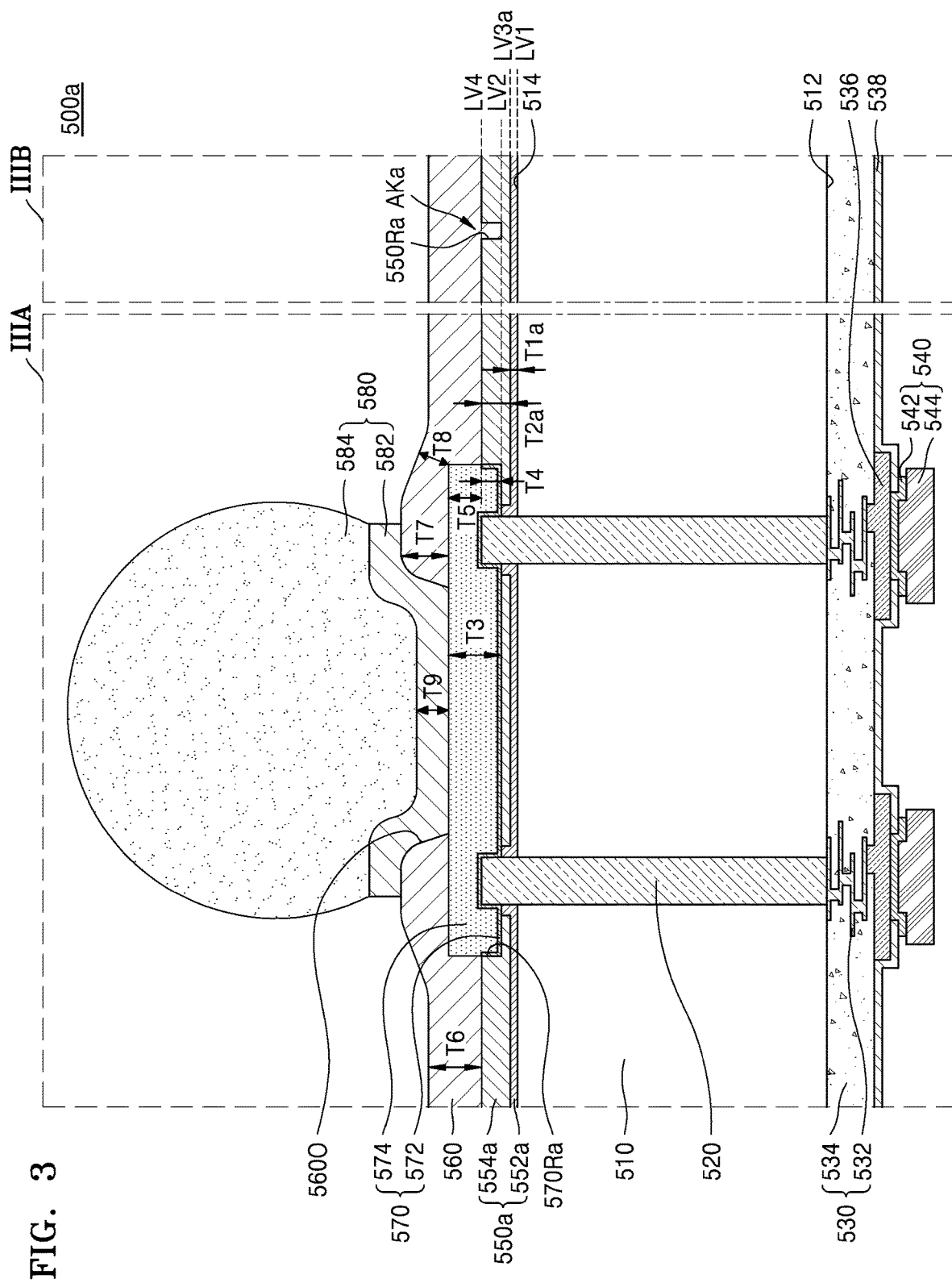
FIG. 3 is an enlarged cross-sectional view illustrating portions of an interposer according to an embodiment of the present invention.

FIG. 3 is an enlarged cross-sectional view illustrating portions of an interposer according to an embodiment of the present invention. Specifically, each of IIIA and IIIB of FIG. 3 is an enlarged cross-sectional view showing a portion corresponding to the regions IIA and IIB of FIG. 1, and the same reference numerals as in FIG. 1 indicate the same components, and repeated descriptions thereof may be omitted.

Referring to FIGS. 1 and 3 together, an interposer 500a may include a base layer 510, a plurality of interposer through electrodes 520, a wiring structure 530, a plurality of micro pads 540, an interposer protective layer 550a, a plurality of interposer pads 570, and a rear wiring protective layer 560.

The interposer protective layer 550a may include a lower interposer protective layer 552a covering the second surface 514 of the base layer 510 and an upper interposer protective layer 554a covering the lower interposer protective layer 552a. The interposer protective layer 550a may be formed of an inorganic material. For example, the lower interposer protective layer 552a may be made of oxide, and the upper interposer protective layer 554a may be made of nitride. The lower interposer protective layer 552a may protrude upward from the lower surface of the upper interposer protective layer 554a while surrounding the side surfaces of the plurality of interposer through electrodes 520, and may be in contact with lower surfaces of the plurality of interposer pads 570. For example, the lower interposer protective layer 552a may extend upward along lateral surfaces of the interposer through electrodes 520 so that the lower interposer protective layer 552a may penetrate the upper interposer protective layer 554a.

The interposer protective layer 550a may have a pad recess 570Ra formed on an upper surface of the interposer protective layer 550a. For example, side walls of the pad recess 570Ra may extend from an upper surface of the upper interposer protective layer 554a toward the base layer 510. A portion of the upper interposer protective layer 554a and a portion of the lower interposer protective layer 552a may be exposed on the bottom surface of the pad recess 570Ra. A portion of the lower interposer protective layer 552a exposed on the bottom surface of the pad recess 570Ra may surround the plurality of interposer through electrodes 520. The pad recess 570Ra may extend from the upper surface of the upper interposer protective layer 554a toward the base layer 510, but may not completely penetrate the interposer protective layer 550a. In some embodiments, the pad recess 570Ra may penetrate an upper portion of the upper interposer protective layer 554a and may not penetrate a lower portion of the upper interposer protective layer 554a.

The lower interposer protective layer 552a may have a first thickness T1a below the upper interposer protective layer 554a, and the upper interposer protective layer 554a may have a second thickness T2a as a maximum thickness. In some embodiments, the first thickness T1a may be less than the second thickness T2a. For example, the second thickness T2a may be about 0.5 μm to about 1.5 μm, and the first thickness T1a may be less than the second thickness T2a, but may be about 0.3 μm or more.

A portion of the lower interposer protective layer 552a that contacts the lower surfaces of the plurality of interposer pads 570 and surrounds side surfaces of the plurality of interposer through electrodes 520 may have a thickness greater than the first thickness T1a in the vertical direction, and the remaining portion (e.g., the other portion) of the lower interposer protective layer 552a may have a first thickness T1a in a vertical direction. In some embodiments, a portion of the lower interposer protective layer 552a that contacts the lower surfaces of the plurality of interposer pads 570 and surrounds side surfaces of the plurality of interposer through electrodes 520 may have the first thickness T1a in a horizontal direction on side surfaces of the plurality of interposer through electrodes 520.

For example, a portion of the lower interposer protective layer 552a that overlaps with the upper interposer protective layer 554a in the vertical direction may have a first thickness T1a that is substantially constant in the vertical direction, and portions of the upper interposer protective layer 554a that do not vertically overlap with the plurality of pad recesses 570Ra and the plurality of interposer pads 570 may have a second thickness T2a that is substantially constant. For example, the maximum thickness of the lower interposer protective layer 552a may be the sum of the thickness of the upper interposer protective layer 554a and the first thickness T1a at the portion overlapping the plurality of pad recesses 570Ra and the plurality of interposer pads 570 in the vertical direction. For example, the lower interposer protective layer 552a may have a maximum thickness at a portion vertically overlapping the interposer pads 570, and the maximum thickness of the lower interposer protective layer 552a may be the same as a sum of a thickness of the upper interposer protective layer 554a in a portion vertically overlapping both of an interposer pad 570 and the lower interposer protective layer 552a and a thickness of the lower interposer protective layer 552a in a portion vertically overlapping both of the interposer pad 570 and the upper interposer protective layer 554a.

A lower surface of the lower interposer protective layer 552a may be at a first vertical level LV1, and a bottom surface of the pad recess 570Ra may be at a second vertical level LV2 that is higher than the first vertical level LV1. A portion of the upper surface of the lower interposer protective layer 552a in contact with the lower surface of the upper interposer protective layer 554a may be at a third vertical level LV3a that is lower than the second vertical level LV2. The upper surface of the upper interposer protective layer 554a may be at a fourth vertical level LV4 that is higher than the second vertical level LV2.

The plurality of interposer through electrodes 520 may extend into the plurality of interposer pads 570. For example, an upper portion of the interposer through electrodes 520 may horizontally overlap and be surrounded by the interposer pads 570. The upper surface of the plurality of interposer through electrodes 520 and the upper surface of the upper interposer protective layer 554a may be at the fourth vertical level LV4, e.g., at the same vertical level.

The lowermost surfaces of the plurality of interposer pads 570, e.g., a portion of the lower surface of the plurality of interposer pads 570 excluding a portion in contact with the plurality of interposer through electrodes 520, may be in contact with the upper interposer protective layer 554a and the lower interposer protective layer 552a. For example, among the lowermost surfaces of the plurality of interposer pads 570, a portion adjacent to the plurality of interposer through electrodes 520 may be in contact with the lower interposer protective layer 552a, and the remaining portions (e.g., the other portions) may be in contact with the upper interposer protective layer 554a. For example, the lower surfaces of the plurality of interposer pads 570 may be all covered by the plurality of interposer through electrodes 520, the upper interposer protective layer 554a, and the lower interposer protective layer 552a.

Among the plurality of interposer through electrodes 520, a portion above the first vertical level LV1 at which the upper surface of the base layer 510 is positioned may be surrounded by the lower interposer protective layer 552a and the plurality of interposer pads 570. For example, a portion higher than the first level LV1 of each of the interposer through electrodes 502 may be surrounded by the lower interposer protective layer 552a and an interposer pad 570. Among the plurality of interposer through electrodes 520, the upper surface and side surface of the uppermost portion of the portion above the upper surface of the base layer 510 may be surrounded by a plurality of interposer pads 570, and a side surface of the remaining portion (e.g., the other portion) may be surrounded by the lower interposer protective layer 552a. For example, a top surface and an upper most portion of a side surface of each of the interposer through electrodes 520 may contact an interposer pad 570, and a lower side surface of each of the interposer through electrode 502 at a vertical level above the first vertical level LV1 may contact the lower interposer protective layer 552a.

A portion buried in the interposer protective layer 550a among the plurality of interposer pads 570 may have a fourth thickness T4, and a portion that is not buried in the interposer protective layer 550a and protrudes from the upper surface of the interposer protective layer 550a may have a fifth thickness T5 that is greater than the fourth thickness T4. For example, a portion of an interposer pad 570 disposed below the fourth vertical level LV4 may have the fourth thickness T4, and a portion of the interposer pad 570 disposed above the fourth vertical level LV4 may have the fifth thickness T5.

The rear wiring protective layer 560 may cover all side surfaces of portions of the plurality of interposer pads 570 protruding from/above the upper surface of the interposer protective layer 550a and cover a portion of the upper surfaces of the plurality of interposer pads 570 but may have a terminal opening 560O that exposes the remaining portions (e.g., the other portions) of the upper surfaces of the plurality of interposer pads 570 without covering the remaining portions.

The interposer protective layer 550a may further include an alignment recess 550Ra vertically extending from the upper surface of the upper interposer protective layer 554a toward the base layer 510. A portion of the upper interposer protective layer 554a may be exposed on the bottom surface of the alignment recess 550Ra. The alignment recess 550Ra extends from the upper surface of the upper interposer protective layer 554a toward the base layer 510, but may not completely penetrate the upper interposer protective layer 554a. In some embodiments, the alignment recess 550Ra may penetrate only an upper portion of the upper interposer protective layer 554a and may not penetrate a lower portion of the upper interposer protective layer 554a.

The alignment recess 550Ra may be filled by a rear wiring protective layer 560. The alignment recess 550Ra may be disposed to be horizontally spaced apart from the pad recess 570Ra. The alignment recess 550Ra may constitute/form an alignment key AKa. The alignment key AKa may be configured by an interface between the interposer protective layer 550a and the rear wiring protective layer 560 extending into the interposer protective layer 550a. For example, the alignment key Aka may be formed of the bottom surface and side surface of the alignment recess 550Ra. For example, the alignment key AKa may extend vertically and/or horizontally along the bottom surface and side surfaces of the alignment recess 550Ra. The bottom surface of the alignment recess 550Ra and the bottom surface of the pad recess 570Ra may be at the second vertical level LV2.

For example, the bottom surface of the alignment recess 550 and the bottom surface of the pad recess 570Ra may be at the same vertical level.

Figure 4:
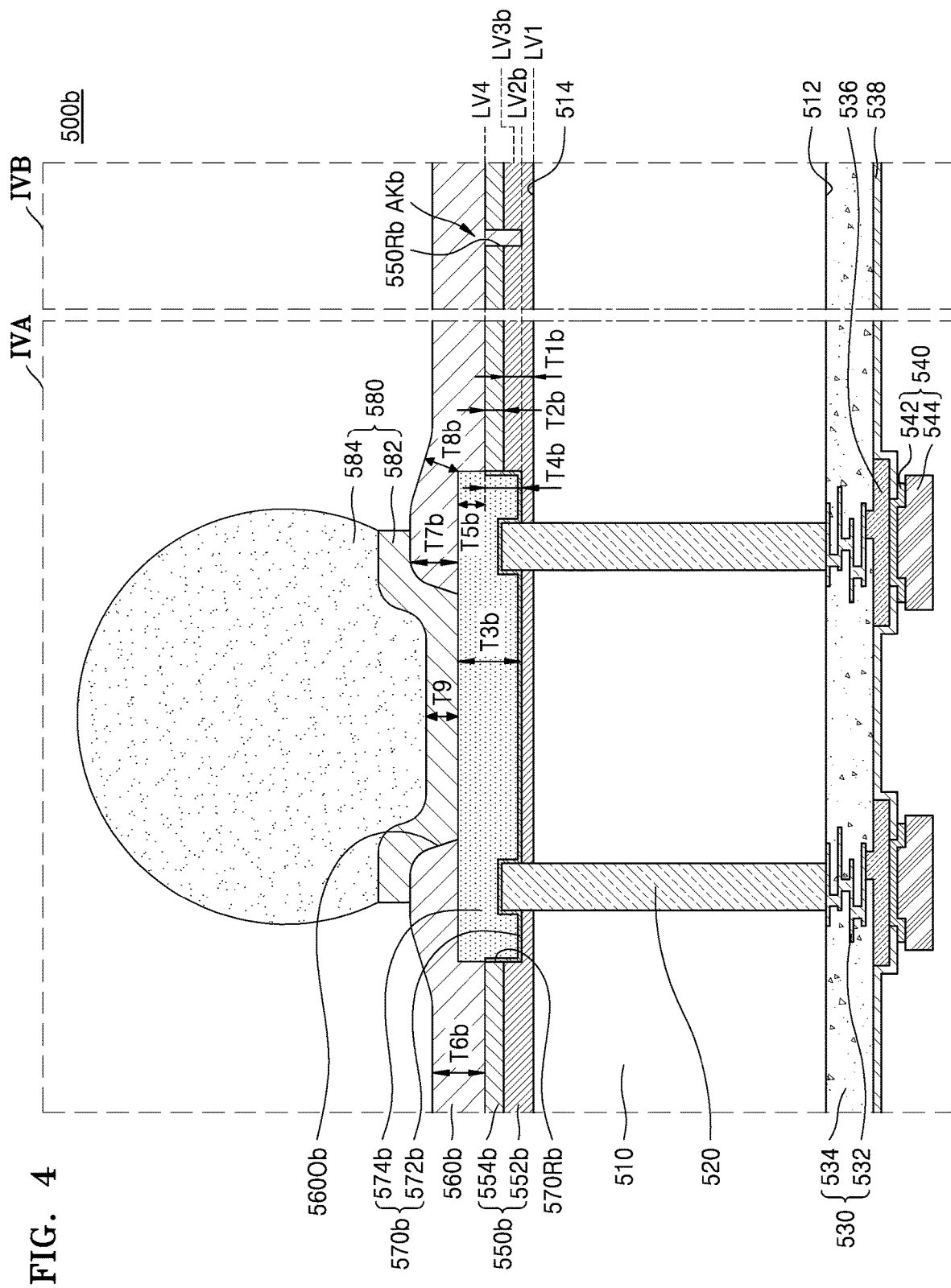
FIG. 4 is an enlarged cross-sectional view illustrating portions of an interposer according to an embodiment of the present invention.

FIG. 4 is an enlarged cross-sectional view illustrating portions of an interposer according to an embodiment of the present invention. Specifically, IVA and IVB of FIG. 4 are enlarged cross-sectional views showing portions respectively corresponding to the regions IIA and IIB of FIG. 1, and the same reference numerals as in FIG. 1 indicate the same components, and repeated descriptions thereof may be omitted.

Referring to FIGS. 1 and 4, an interposer 500b includes a base layer 510, a plurality of interposer through electrodes 520, a wiring structure 530, a plurality of micro pads 540, an interposer protective layer 550b, a plurality of interposer pads 570b, and a rear wiring protective layer 560b.

The interposer protective layer 550b may include a lower interposer protective layer 552b covering the second surface 514 of the base layer 510 and an upper interposer protective layer 554b covering the lower interposer protective layer 552b. The interposer protective layer 550b may be formed of an inorganic material. For example, the interposer protective layer 550b may be formed of silicon oxide, silicon nitride, or a stacked structure of silicon oxide and silicon nitride. For example, the lower interposer protective layer 552b may be made of oxide, and the upper interposer protective layer 554b may be made of nitride.

The interposer protective layer 550b may have a pad recess 570Rb vertically extending from an upper surface of the upper interposer protective layer 554b toward the base layer 510. A portion of the lower interposer protective layer 552b may be exposed on the bottom surface of the pad recess 570Rb.

Spatially relative terms, such as "vertical," "horizontal," "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The lower interposer protective layer 552b and the upper interposer protective layer 554b may have a first thickness T1b and a second thickness T2b as a maximum thickness, respectively. For example, portions of the lower interposer protective layer 552b and the upper interposer protective layer 554b that do not vertically overlap with the plurality of pad recesses 570Rb and the plurality of interposer pads 570b may respectively have the first thickness T1b and the second thickness T2b that are substantially constant. In some embodiments, the first thickness T1b may be less than the second thickness T2b. For example, the second thickness T2b may be about 0.5 μm to about 1.5 μm, and the first thickness T1b may be less than the second thickness T2 and may be about 0.3 μm or more.

A lower surface of the lower interposer protective layer 552b may be at a first vertical level LV1, and a bottom surface of the pad recess 570Rb may be at a second vertical level LV2b that is higher than the first vertical level LV1.

The upper surface of the lower interposer protective layer 552b and the lower surface of the upper interposer protective layer 554b may contact each other at a third vertical level LV3b that is higher than the second vertical level LV2b. The upper surface of the upper interposer protective layer 554b may be at a fourth vertical level LV4 that is higher than the third vertical level LV3b.

Each of the plurality of interposer pads 570b may include a seed layer 572b covering the bottom surface and side surfaces of the pad recess 570Rb and a conductive pad layer 574b on the seed layer 572b. For example, the seed layer 572b may cover the surface of the interposer protective layer 550b exposed in the pad recess 570Rb. The seed layer 572b may conformally cover the bottom surface and side surfaces of the pad recess 570Rb. At the side surface of the pad recess 570Rb, an uppermost end of the seed layer 572b may be at the fourth vertical level LV4b.

Each of the plurality of interposer pads 570b may fill the pad recess 570Rb and protrude from the upper surface of the interposer protective layer 550b. For example, the interposer pads 570b may protrude from the upper surface of the upper interposer protective layer 554b. For example, upper surfaces of the plurality of interposer pads 570b may be at a vertical level that is higher than the fourth vertical level LV4. Lower surfaces of the plurality of interposer pads 570b may be at the second vertical level LV2b.

The plurality of interposer through electrodes 520 may extend into the plurality of interposer pads 570b. The upper surface of the plurality of interposer through electrodes 520 and the upper surface of the upper interposer protective layer 554b may be at the fourth vertical level LV4. For example, the upper surfaces of the interposer through electrodes 520 and the upper surface of the upper interposer protective layer 554b may be at the same vertical level.

The lowermost surfaces of the plurality of interposer pads 570b, e.g., a portion excluding the portion in contact with the plurality of interposer through electrodes 520, among the lower surfaces of the plurality of interposer pads 570b may all be in contact with the lower interposer protective layer 552b. For example, the lower surfaces of the plurality of interposer pads 570b may contact and/or be covered by the plurality of interposer through electrodes 520 and the lower interposer protective layer 552b.

Among the plurality of interposer through electrodes 520, a portion above the first vertical level LV1 at which the upper surface of the base layer 510 is positioned may be surrounded by the lower interposer protective layer 552b and the plurality of interposer pads 570b. Among the plurality of interposer through electrodes 520, the upper surface and side surface of the uppermost portion of the portion above the upper surface of the base layer 510 may be surrounded by a plurality of interposer pads 570b, and a side surface of the remaining portion (e.g., the other portion) may be surrounded by the lower interposer protective layer 552b.

Each of the plurality of interposer pads 570b may have a third thickness T3b as a maximum thickness. The third thickness T3b may be about 2 μm to about 7 μm. A portion below the fourth vertical level LV4 among the plurality of interposer pads 570b, e.g., a portion buried in the interposer protective layer 550b, may have a fourth thickness T4, and a portion above the fourth vertical level LV4, e.g., not buried in the interposer protective layer 550b, and protruding from/above the upper surface of the interposer protective layer 550b may have a fifth thickness T5b that is less than the fourth thickness T4b. For example, the fifth thickness T5b may be less than the fourth thickness T4b, but may have a value of about 4 μm or less.

The rear wiring protective layer 560b may have a terminal opening 5600b exposing a portion of the plurality of interposer pads 570b and may cover the interposer protective layer 550b and portions of the plurality of interposer pads 570b. The rear wiring protective layer 560b may cover all the sides of the portions of the plurality of interposer pads 570b protruding from/above the upper surface of the interposer protective layer 550b and cover a portion of the upper surface of the interposer pads 570b but may have a terminal opening 5600b that exposes the remaining portion (e.g., the other portion) of the upper surface of the interposer pads 570b. The rear wiring protective layer 560b may be made of an organic material. For example, the rear wiring protective layer 560b may be formed of a polymer material.

The rear wiring protective layer 560b may have a sixth thickness T6b on the interposer protective layer 550b. For example, the rear wiring protective layer 560b may be substantially flat on most of the interposer protective layer 550b. For example, on the interposer protective layer 550b, the lowest thickness of the rear wiring protective layer 560b may be the sixth thickness T6b, and the thickness of the rear wiring protective layer 560b adjacent to the plurality of interposer pads 570b on the interposer protective layer 550b may be greater than the sixth thickness T6. The sixth thickness T6b may be greater than the fifth thickness T5b. For example, the sixth thickness T6b may be about 3 μm to about 4.5 The highest thickness of the rear wiring protective layer 560b on the plurality of interposer pads 570b may be a seventh thickness T7b, and the lowest thickness of the rear wiring protective layer 560b on the interposer pads 570b may be an eighth thickness T8b. For example, the seventh thickness T7b may be about 3 μm to about 4.5 and the eighth thickness T8b may be about 1 μm to about 2.5 μm.

The rear UBM layer 582 may conformally cover a portion of the upper surface of the interposer pad 570b exposed by the terminal opening 5600b and a portion of the rear wiring protective layer 560b adjacent thereto.

The interposer protective layer 550b may further have an alignment recess 550Rb vertically extending from the upper surface of the upper interposer protective layer 554b toward the base layer 510. A portion of the lower interposer protective layer 552b may be exposed on the bottom surface of the alignment recess 550Rb. The alignment recess 550Rb may vertically extend from the upper surface of the upper interposer protective layer 554b toward the base layer 510, but may not completely penetrate the interposer protective layer 550b. In some embodiments, the alignment recess 550Rb may penetrate the upper interposer protective layer 554b, but may penetrate only an upper portion of the lower interposer protective layer 552b and may not penetrate a lower portion thereof. For example, the alignment recess 550 Rb may expose the lower portion of the lower interposer protective layer 552b at the bottom of the alignment recess 550 Rb.

The alignment recess 550Rb may be filled by a rear wiring protective layer 560b. The alignment recess 550Rb may be disposed to be horizontally spaced apart from the pad recess 570Rb. The alignment recess 550Rb may constitute/form an alignment key AKb. The alignment key AKb may be configured by an interface between the interposer protective layer 550b and the rear wiring protective layer 560b extending into the interposer protective layer 550b. For example, the alignment key AKb may be formed of the bottom surface and side surface of the alignment recess 550Rb. For example, the alignment key AKb may extend vertically and/or horizontally along the bottom surface and side surfaces of the alignment recess 550Rb. The bottom surface of the alignment recess 550Rb and the bottom surface of the pad recess 570Rb may be at the second vertical level LV2b. For example, the bottom surface of the alignment recess 550Rb and the bottom surface of the pad recess 570Rb may be at the same vertical level.

FIG. 5 is an enlarged cross-sectional view illustrating portions of an interposer according to an embodiment of the present invention. Specifically, VA and VB of FIG. 5 are enlarged cross-sectional views showing portions respectively corresponding to the regions IIA and IIB of FIG. 1, and the same reference numerals as in FIG. 1 indicate the same components, and repeated descriptions thereof may be omitted.

Referring to FIGS. 1 and 5, an interposer 500c includes a base layer 510, a plurality of interposer through electrodes 520, a wiring structure 530, a plurality of micro pads 540, an interposer protective layer 550c, a plurality of interposer pads 570b, and a rear wiring protective layer 560b.

The interposer protective layer 550c may include a lower interposer protective layer 552c covering the second surface 514 of the base layer 510 and an upper interposer protective layer 554c covering the lower interposer protective layer 552c. The interposer protective layer 550c may be formed of an inorganic material. For example, the lower interposer protective layer 552c may be made of oxide, and the upper interposer protective layer 554c may be made of nitride. The lower interposer protective layer 552c may protrude upward from the lower surface of the upper interposer protective layer 554c while surrounding the side surfaces of the plurality of interposer through electrodes 520, and may be in contact with lower surfaces of the plurality of interposer pads 570b. For example, a portion of the lower interposer protective layer 552c may be disposed at a higher vertical level than the lower surface of the upper inter poser protective layer 554c.

The interposer protective layer 550c may have a pad recess 570Rc extending from the upper surface of the upper interposer protective layer 554c toward the base layer 510. A portion of the upper interposer protective layer 554c and a portion of the lower interposer protective layer 552c may be exposed on the bottom surface of the pad recess 570Rc. A portion of the lower interposer protective layer 552c exposed on the bottom surface of the pad recess 570Rc may surround the plurality of interposer through electrodes 520.

The lower interposer protective layer 552c may have a first thickness T1c below the upper interposer protective layer 554c, and the upper interposer protective layer 554c may have a second thickness T2c as a maximum thickness. A portion of the lower interposer protective layer 552c that contacts the lower surfaces of the plurality of interposer pads 570b and surrounds side surfaces of the plurality of interposer through electrodes 520 may have a thickness greater than the first thickness T1c in the vertical direction, and the remaining portion (e.g., the other portion) of the lower interposer protective layer 552c may have the first thickness T1c in a vertical direction. In some embodiments, a portion of the lower interposer protective layer 552c that contacts the lower surfaces of the plurality of interposer pads 570b and surrounds side surfaces of the plurality of interposer through electrodes 520 may have the first thickness T1c in a horizontal direction on side surfaces of the plurality of interposer through electrodes 520. For example, the horizontal thickness of the lower interposer protective layer 552c in the portion surrounding the interposer through electrodes 520 may be the same as the vertical thickness of the lower interposer protective layer 552c disposed below and/or vertically overlapping the upper interposer protective layer 554c.

For example, the lower interposer protective layer 552c may have the first thickness T1c that is substantially constant in the vertical direction at a portion that overlaps with the upper interposer protective layer 554c in the vertical direction, and the upper interposer protective layer 554c may have a substantially constant second thickness T2c at portions that do not vertically overlap the plurality of pad recesses 570Rc and the plurality of interposer pads 570b. For example, the maximum thickness of the lower interposer protective layer 552c may be the same as the sum of the thickness of the upper interposer protective layer 554c and the thickness of the lower interposer protective layer 552c (e.g., the first thickness T1c) at the portion in which the plurality of interposer pads 570b overlap the lower and upper interposer protective layers 552c and 554c in the vertical direction. In some embodiments, the first thickness T1c may be less than the second thickness T2c. For example, the second thickness T2c may be about 0.5 μm to about 1.5 and the first thickness T1c may be less than the second thickness T2c, but may be about 0.3 μm or more.

A lower surface of the lower interposer protective layer 552c may be at a first vertical level LV1, and a bottom surface of the pad recess 570Rc may be at a second vertical level LV2b that is higher than the first vertical level LV1. A portion of the upper surface of the lower interposer protective layer 552c in contact with the lower surface of the upper interposer protective layer 554c may be at a third vertical level LV3c that is lower than the second vertical level LV2b. The upper surface of the upper interposer protective layer 554c may be at a fourth vertical level LV4 that is higher than the second vertical level LV2b.

Each of the plurality of interposer pads 570b may include a seed layer 572b covering the bottom surface and side surfaces of the pad recess 570Rc, e.g., the surface of the interposer protective layer 550c exposed in the pad recess 570Rc, and a conductive pad layer 574b on the seed layer 572b.

Each of the plurality of interposer pads 570b may fill a pad recess 570Rc and protrude from the upper surface of the interposer protective layer 550c. For example, the interposer pads 570b may protrude from the upper surface of the upper interposer protective layer 554c. For example, upper surfaces of the plurality of interposer pads 570b may be at a vertical level that is higher than the fourth vertical level LV4. Lower surfaces of the plurality of interposer pads 570b may be at the second vertical level LV2b.

A portion buried in and/or below the interposer protective layer 550c among the plurality of interposer pads 570b may have a fourth thickness T4b, and a portion that is not buried in and/or above the interposer protective layer 550c and protrudes from the upper surface of the interposer protective layer 550c may have a fifth thickness T5b that is less than the fourth thickness T5b.

The plurality of interposer through electrodes 520 may extend into the plurality of interposer pads 570b. The upper surfaces of the plurality of interposer through electrodes 520 and the upper surface of the upper interposer protective layer 554c may be at the fourth vertical level LV4. For example, the upper surfaces of the interposer through electrodes 520 and the upper surface of the interposer protective layer 550c may be at the same vertical level. In certain embodiments, top surfaces of the interposer through electrodes 520 and a top surface of the interposer protective layer 550c may be at different vertical levels as shown in FIGS. 4 and 5.

The lowermost surfaces of the plurality of interposer pads 570b, e.g., a portion of the lower surface of the plurality of interposer pads 570b excluding a portion in contact with the plurality of interposer through electrodes 520, may be in contact with the upper interposer protective layer 554c and the lower interposer protective layer 552c. For example, among the lowermost surfaces of the plurality of interposer pads 570, a portion adjacent to the plurality of interposer through electrodes 520 may be in contact with the lower interposer protective layer 552c, and the remaining portions (e.g., the other portions) may be in contact with the upper interposer protective layer 554c. For example, the lower surfaces of the plurality of interposer pads 570b may be all covered by and/or contact the plurality of interposer through electrodes 520, the upper interposer protective layer 554c, and the lower interposer protective layer 552c.

Among the plurality of interposer through electrodes 520, a portion above the first vertical level LV1 at which the upper surface of the base layer 510 is positioned may be surrounded by the lower interposer protective layer 552c and the plurality of interposer pads 570b. Among the plurality of interposer through electrodes 520, the upper surface and side surface of the uppermost portion of the portion above the upper surface of the base layer 510 may be surrounded by a plurality of interposer pads 570b, and a side surface of the remaining portion above the upper surface of the base layer 510 may be surrounded by the lower interposer protective layer 552c.

The rear wiring protective layer 560b may have a terminal opening 5600b exposing a portion of the plurality of interposer pads 570b and may cover the interposer protective layer 550c and portions of the plurality of interposer pads 570b.

The interposer protective layer 550c may further have an alignment recess 550Rc vertically extending from the upper surface of the upper interposer protective layer 554c toward the base layer 510. A portion of the upper interposer protective layer 554c may be exposed on the bottom surface of the alignment recess 550Rc. The alignment recess 550Rc may vertically extend from the upper surface of the upper interposer protective layer 554c toward the base layer 510, but may not completely penetrate the upper interposer protective layer 550c. In some embodiments, the alignment recess 550Rc may penetrate only an upper portion of the upper interposer protective layer 554c and may not penetrate a lower portion of the upper interposer protective layer 554c.

The alignment recess 550Rc may be filled by a rear wiring protective layer 560b. The alignment recess 550Rc may be disposed to be horizontally spaced apart from the pad recess 570Rc. The alignment recess 550Rc may constitute/form an alignment key AKc. The alignment key AKc may be configured by an interface between the interposer protective layer 550c and the rear wiring protective layer 560b extending into the interposer protective layer 550c. For example, the alignment key AKc may be formed of the bottom surface and side surface of the alignment recess 550Rc. For example, the alignment key AKc may vertically and horizontally extend along the bottom surface and side surfaces of the alignment recess 550Rc. The bottom surface of the alignment recess 550Rc and the bottom surface of the pad recess 570Rb may be at the second vertical level LV2b. For example, the bottom surface of the alignment recess 550Rc and the bottom surface of the pad recess 570Rb may be at the same vertical level.

FIGS. 6A to 6G are cross-sectional views illustrating a method of manufacturing an interposer according to an embodiment of the present invention in stages. Specifically, FIGS. 6A to 6G are cross-sectional views illustrating a method of manufacturing the interposer shown in FIGS. 1 and 2 in stages.

Figure 6A:
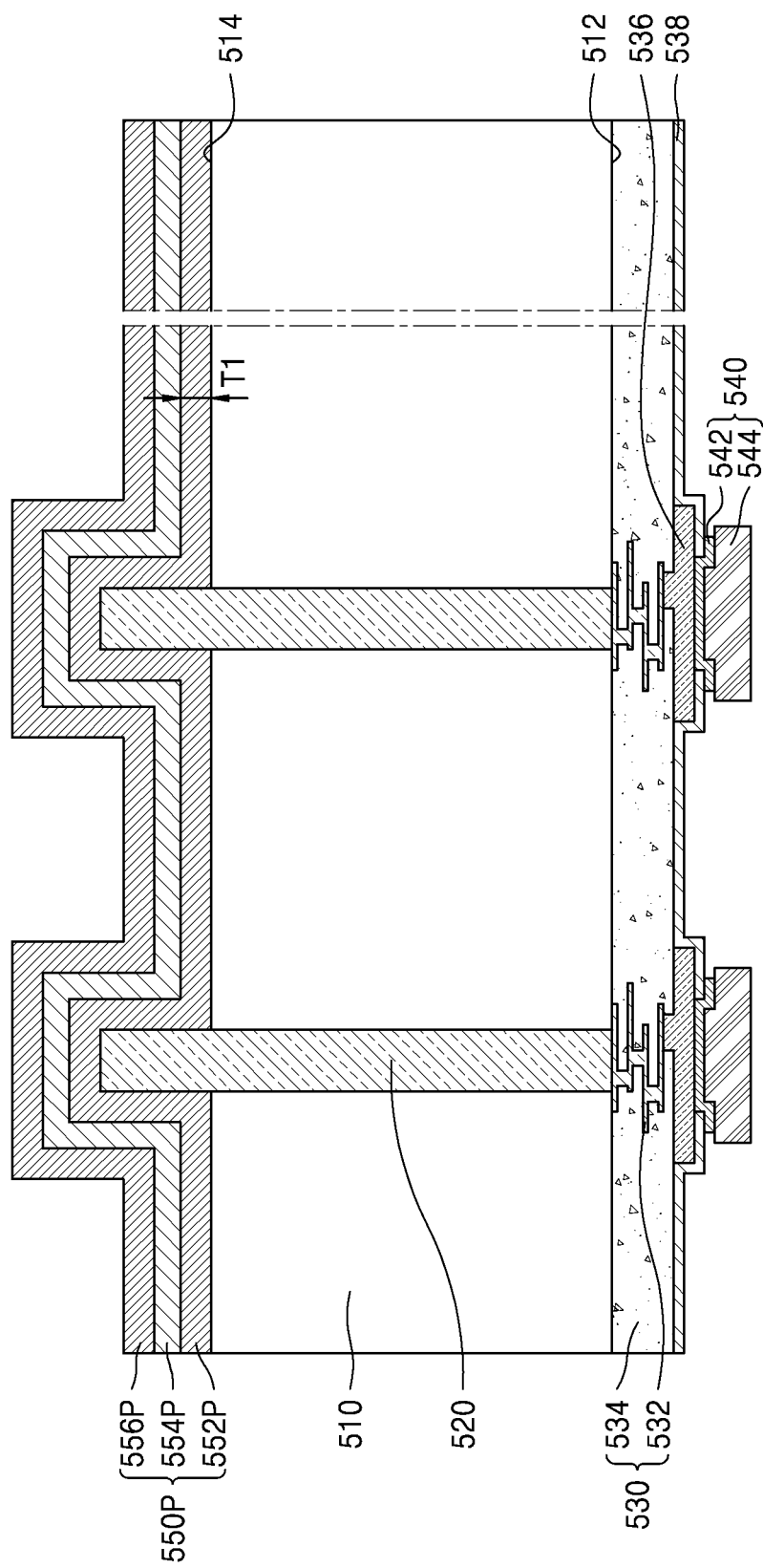

Referring to FIG. 6A, after preparing the base layer 510, a plurality of interposer through electrodes 520 penetrating the base layer 510 from the first surface 512 to the second surface 514 of the base layer 510, a wiring structure 530 disposed on the first surface 512 of the base layer 510, and a plurality of micro pads 540 on the first surface 512 of the base layer 510 and electrically connected to the wiring structure 530 are formed.

The base layer 510 on which the plurality of interposer through electrodes 520, the wiring structure 530, and the plurality of micro pads 540 are formed may be attached to a support substrate such that the first surface 512 faces the support substrate. A release adhesive film may be interposed between the base layer 510 and the support substrate and the base layer 510 may be attached to the support substrate by the release adhesive film. After attaching the base layer 510 to the support substrate, by removing a portion opposite to the first surface 512 of the base layer 510, a plurality of interposer through electrodes 520 may be formed to protrude outward from the second surface 514 of the base layer 510. For example, an upper portion of the base layer 510 may be removed to form the second surface 514 of the base layer 510 so that the second surface 514 may be at a lower vertical level than top surfaces of the interposer through electrodes 520.

On the second surface 514 of the base layer 510, by sequentially forming a preliminary lower interposer 552P that conformally covers the second surface 514 of the base layer 510 and the side surfaces and upper surfaces of the plurality of interposer through electrodes 520 protruding outward from the second surface 514 of the base layer 510, a preliminary upper interposer protective layer 554P, and a cover interposer protective layer 556P, a preliminary interposer protective layer 550P may be formed. For example, the preliminary interposer protective layer 550P may include the preliminary lower interposer protective layer 552P, the preliminary upper interposer protective layer 554P, and the cover interposer protective layer 556P. The preliminary lower interposer protective layer 552P may be formed to have a first thickness T1, and the preliminary upper interposer protective layer 554P may be formed to have a thickness greater than the second thickness T2 of FIG. 6B.

Each of the preliminary lower interposer protective layer 552P, the preliminary upper interposer protective layer 554P, and the cover interposer protective layer 556P may be formed of an inorganic material. For example, the preliminary lower interposer protective layer 552P, the preliminary upper interposer protective layer 554P, and the cover interposer protective layer 556P may be respectively formed of silicon oxide, silicon nitride, and silicon oxide.

Figure 6B:
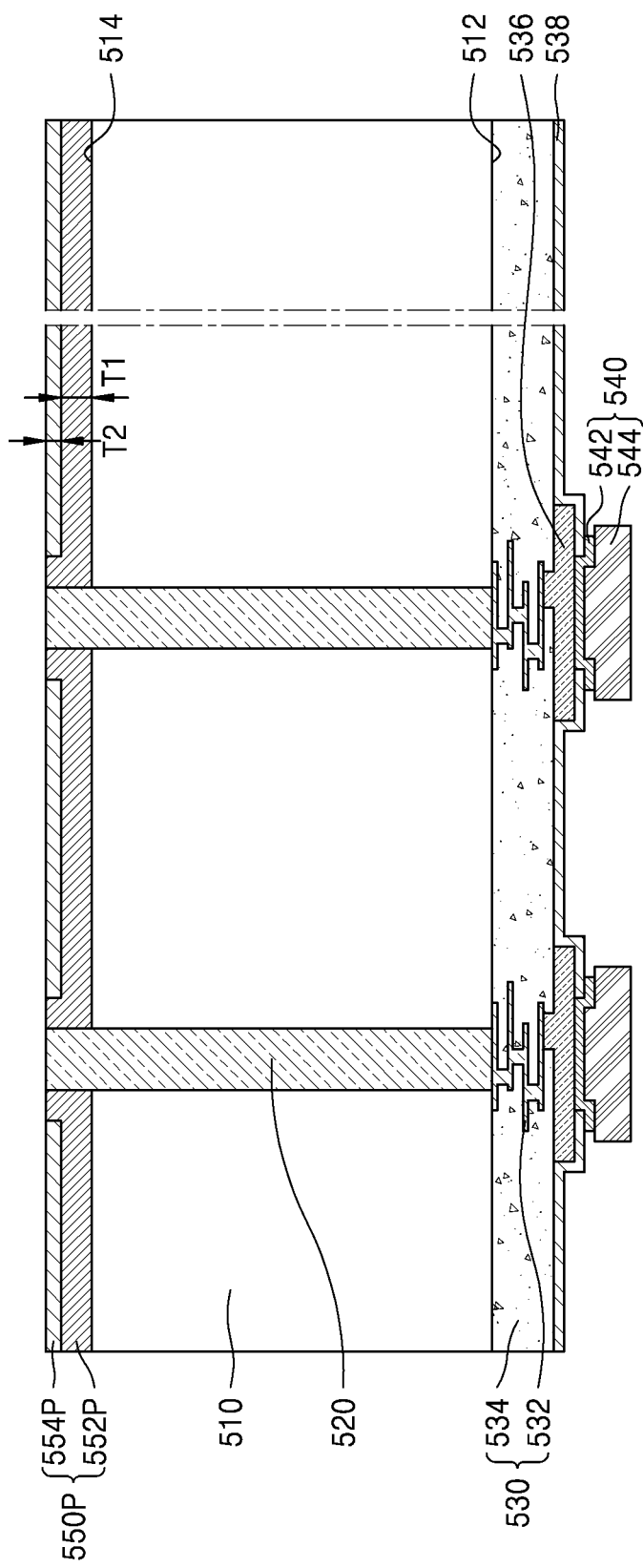

Referring to FIGS. 6A and 6B together, until all of the cover interposer protective layers 556P are removed and the thickness of the preliminary upper interposer protective layer 554P becomes the second thickness T2, a planarization process is performed in which upper portions of the preliminary interposer protective layer 550P and the plurality of interposer through electrodes 520 are removed.

Figure 6C:
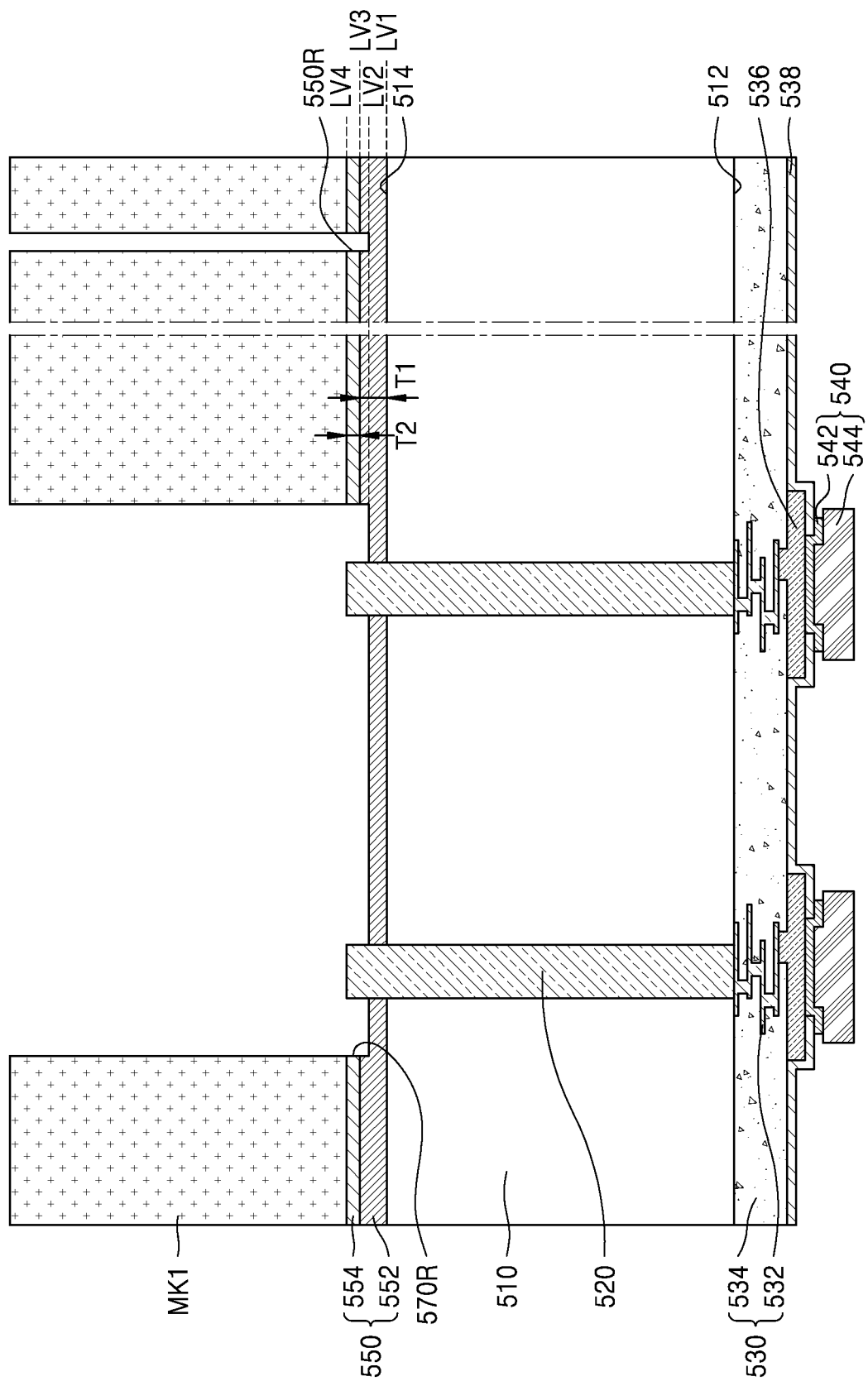

Referring to FIGS. 6B and 6C together, after forming a first mask pattern MK1 covering a portion of the preliminary interposer protective layer 550P and not covering the plurality of interposer through electrodes 520, by removing a portion of the preliminary interposer protective layer 550P using the first mask pattern MK1 as an etching mask, an interposer protective layer 550 having a pad recess 570R and an alignment recess 550R spaced apart from each other may be formed. For example, the interposer protective layer 550 may include a lower interposer protective layer 552 and an upper interposer protective layer 554. The interposer protective layer 550 may be formed such that a portion of the lower interposer protective layer 552 is exposed on the bottom surface of each of the pad recess 570R and the alignment recess 550R.

A lower surface of the lower interposer protective layer 552 may be at a first vertical level LV1, and a bottom surface of the pad recess 570R may be formed to be positioned at a second vertical level LV2 that is higher than the first vertical level LV1. The upper surface of the lower interposer protective layer 552 and the lower surface of the upper interposer protective layer 554 may contact each other at a third vertical level LV3 that is higher than the second vertical level LV2. An upper surface of each of the upper interposer protective layer 554 and the plurality of interposer through electrodes 520 may be formed to be positioned at a fourth vertical level LV4 that is higher than the third vertical level LV3. For example, the upper surface of the upper interposer protective layer 554 and upper surfaces of the interposer through electrodes 520 may be at the same vertical level.

After the pad recess 570R and the alignment recess 550R are formed in the interposer protective layer 550, the first mask pattern MK1 may be removed.

Figure 6D:
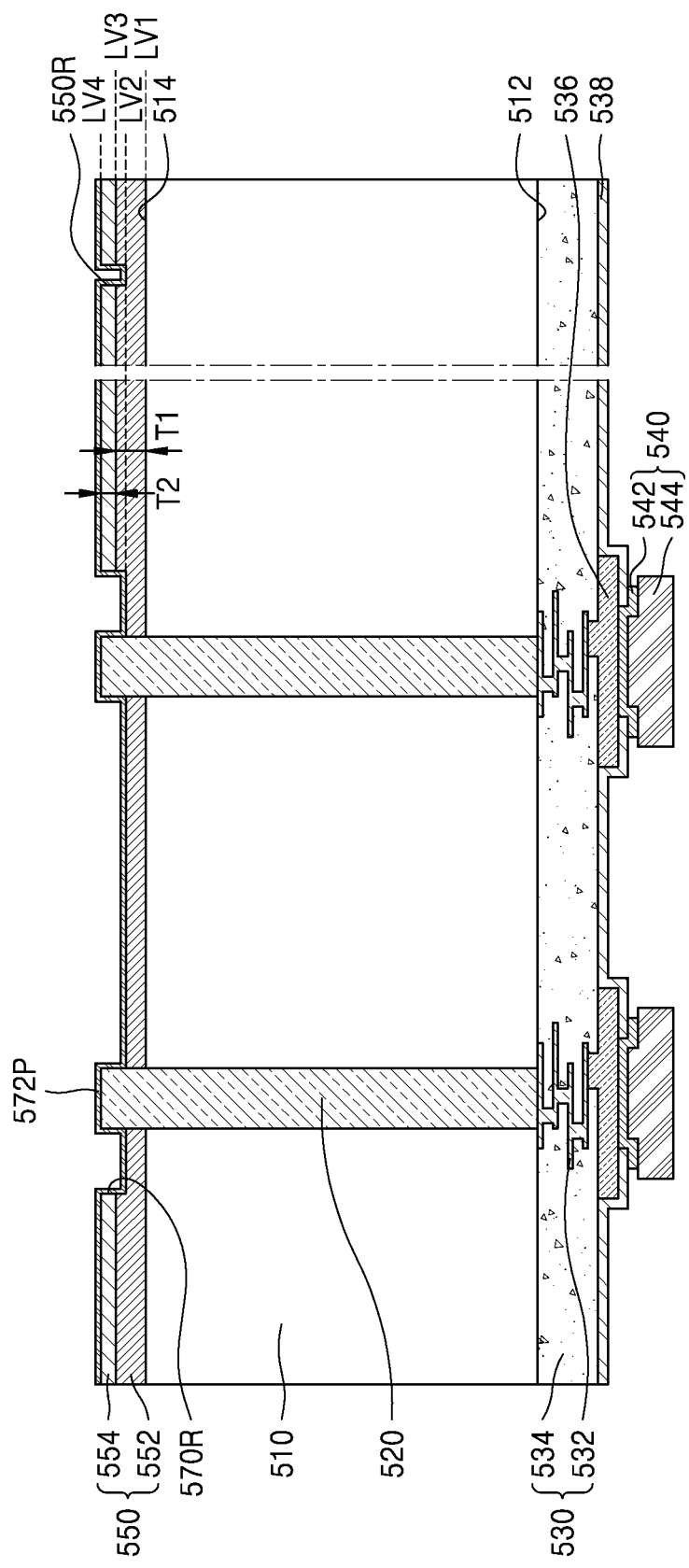

Referring to FIG. 6D, a preliminary seed layer 572P conformally covering exposed surfaces of the interposer protective layer 550 and the plurality of interposer through electrodes 520 is formed. The preliminary seed layer 572P may be formed to conformally cover the uppermost surface of the interposer protective layer 550, the bottom surface and side surfaces of each of the pad recess 570R and the alignment recess 550R, and the upper surfaces and the side surfaces of the plurality of interposer through electrodes 520 exposed in the pad recess 570R.

Referring to FIG. 6E, a second mask pattern MK2 covering the preliminary seed layer 572P is formed. The second mask pattern MK2 may be formed to cover portions of the preliminary seed layer 572P including a portion of the preliminary seed layer 572P that vertically overlaps with the alignment recess 550R without covering a portion of the preliminary seed layer 572P that vertically overlaps with the pad recess 570R. For example, the second mask pattern MK2 may expose a portion of the preliminary seed layer 572P vertically overlapping the pad recess 570R.

Thereafter, a conductive pad layer 574 is formed on the preliminary seed layer 572P that is not covered by the second mask pattern MK2 and is exposed. The conductive pad layer 574 may be formed using a plating method using the preliminary seed layer 572P as a seed. In some embodiments, the conductive pad layer 574 may be formed using an electrolytic plating method using the preliminary seed layer 572P as a seed. The conductive pad layer 574 may be formed so that its upper surface is positioned at a higher vertical level than the fourth vertical level LV4.

Figure 6F:
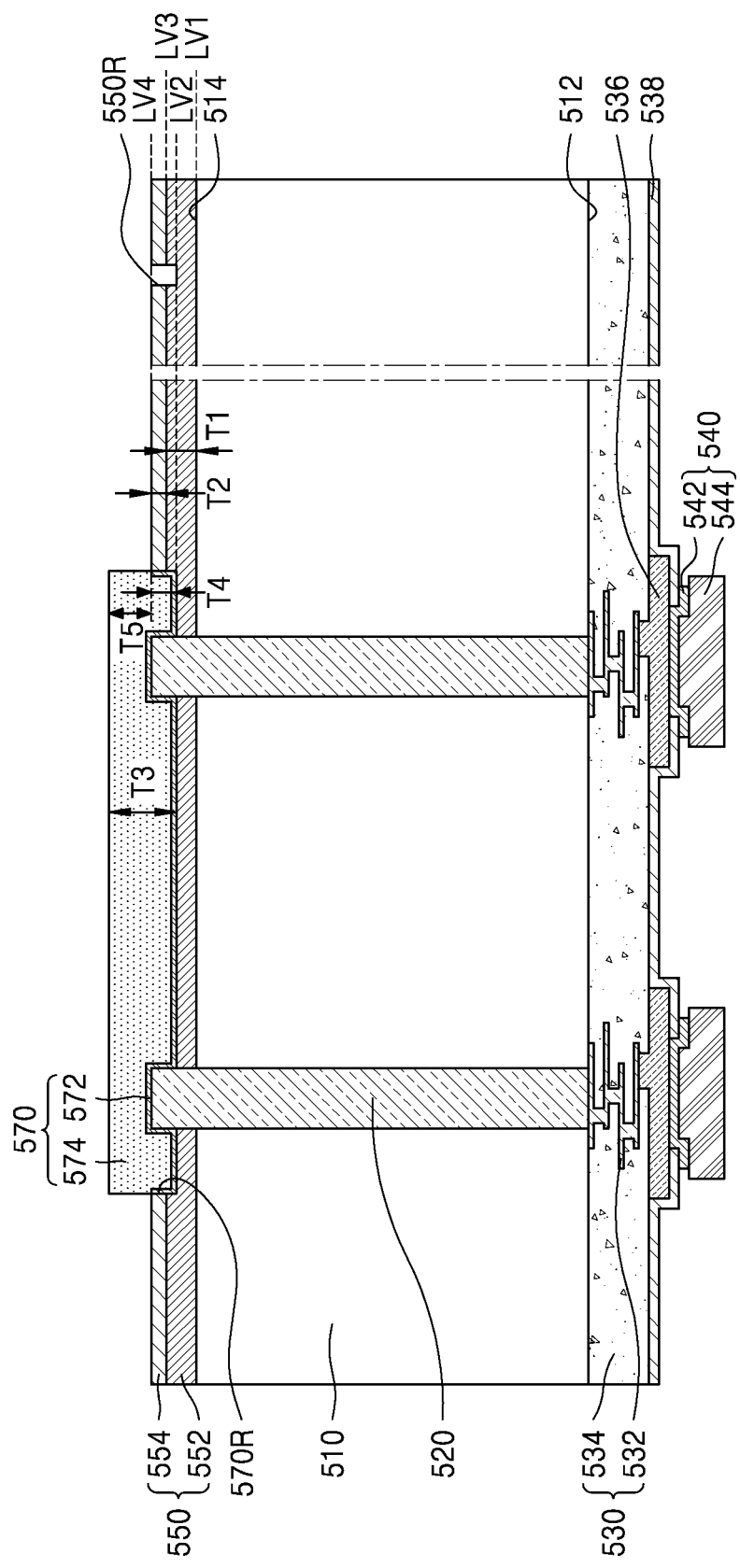

Referring to FIGS. 6E and 6F together, after removing the second mask pattern MK2, a portion of the preliminary seed layer 572P that is not covered and exposed by the conductive pad layer 574 is removed, so that an interposer pad 570 including a seed layer 572 and a conductive pad layer 574 is formed. The interposer pad 570 may be formed to have a third thickness T3 as a maximum thickness.

A portion of the interposer pad 570 disposed below the fourth vertical level LV4, e.g., a portion buried in the interposer protective layer 550, may be formed to have a fourth thickness T4, and a portion of the interposer pad 570 disposed above the fourth vertical level LV4, e.g., the portion that is not buried in the interposer protective layer 550 and protrudes from/above the upper surface of the interposer protective layer 550, may be formed to have a fifth thickness T5 greater than the fourth thickness T4.

Figure 6G:
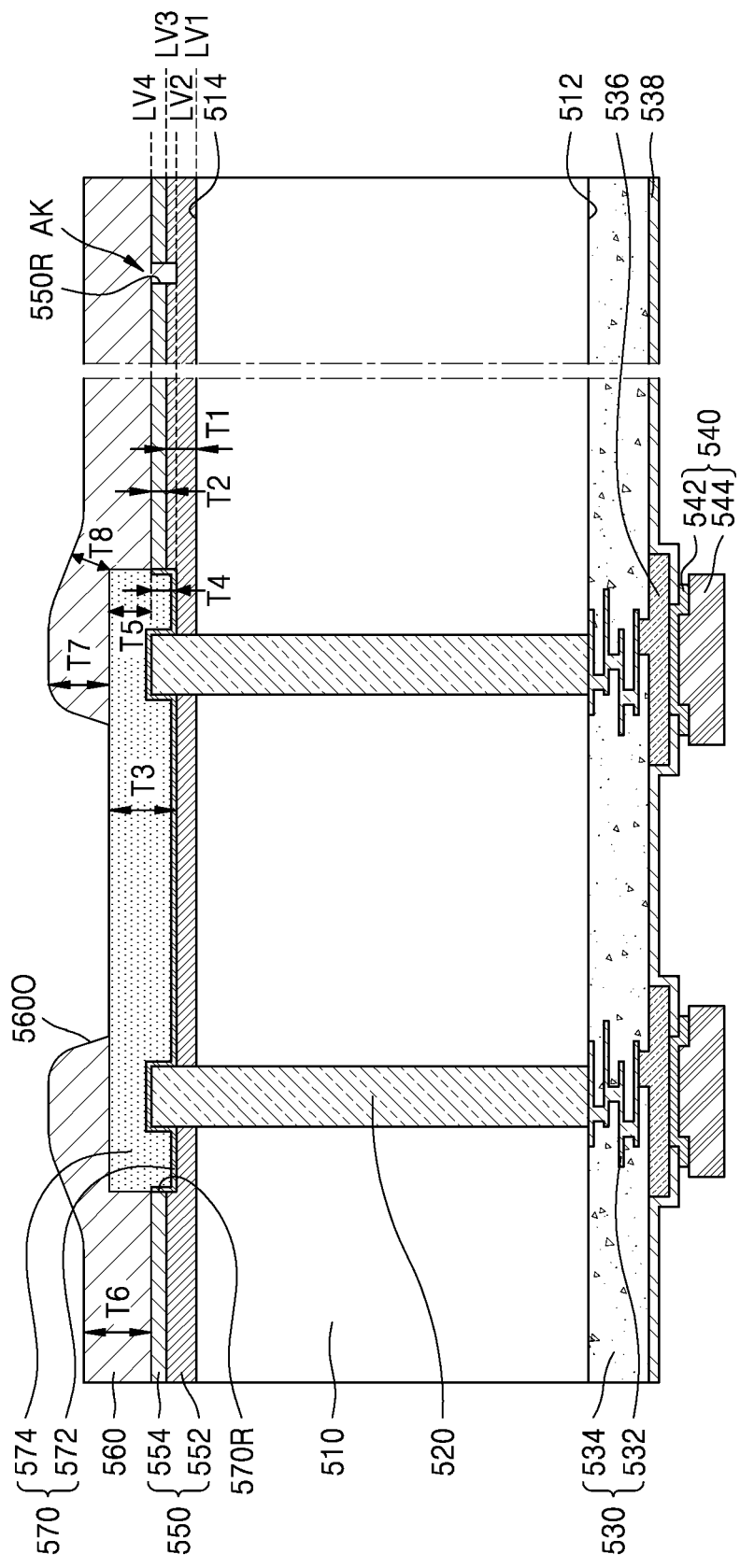

Referring to FIG. 6G, a rear wiring protective layer 560 that has a terminal opening 560O exposing a portion of the plurality of interposer pads 570 and covers the remaining portions (e.g., the other portions) of the plurality of interposer pads 570 and the interposer protective layer 550 is formed. The rear wiring protective layer 560 may be formed to cover all side surfaces of portions of the plurality of interposer pads 570 protruding from the upper surface of the interposer protective layer 550 and cover a portion of the upper surface of the interposer pads 570, but to have a terminal opening 560O not covering and exposing the remaining portion (e.g., the other portion) of the upper surface. For example, the terminal opening may expose a top surface of an interposer pad 570.

The rear wiring protective layer 560 may be formed to have a sixth thickness T6 on the interposer protective layer 550. For example, the rear wiring protective layer 560 may have a sixth thickness T6 greater than the fifth thickness T5 as the lowest thickness among portions formed on and/or vertically overlapping the interposer protective layer 550, and a portion adjacent to the plurality of interposer pads 570 formed on and/or vertically overlapping the interposer protective layer 550 may be formed to have a value greater than the sixth thickness T6. The rear wiring protective layer 560 may be formed to have a seventh thickness T7 as the highest thickness and an eighth thickness T8 as the lowest thickness among portions formed on and/or vertically overlapping the plurality of interposer pads 570.

The alignment recess 550R may be filled by the rear wiring protective layer 560 to constitute/form the alignment key AK configured by an interface of the interposer protective layer 550 and the rear wiring protective layer 560 extending into the interposer protective layer 550, e.g., along the bottom surface and side surfaces of the alignment recess 550R.

Then, as shown in FIGS. 1 and 2, by forming an interposer connection terminal 580 including and/or formed of a rear UBM layer 582 on interposer pad 570 and an interposer conductive cap 584 on the rear UBM layer 582, an interposer 500 may be formed.

Referring to FIGS. 1, 2, and 6A to 6G, in relation to the interposer 500 according to an embodiment of the present invention, since a lower portion of the interposer pad 570 is formed to fill the pad recess 570R, the thickness of the interposer pad 570 may be increased, e.g., without increasing thicknesses of interposers 500. Thick interposer pads 570 may be beneficial for preventing warpage in the interposer 500. Since the manufacturing method of the interposer 500 according to certain embodiments of the present invention does not perform a separate process for forming the alignment key AK, manufacturing cost of the interposer 500 may be reduced by reducing the process steps.

FIGS. 7A to 7D are cross-sectional views illustrating a method of manufacturing an interposer according to an embodiment of the present invention in stages. Specifically, FIGS. 7A to 7D are cross-sectional views illustrating a method of manufacturing the interposer shown in FIG. 3 in stages. In the description of FIGS. 7A to 7D, the content overlapping with the description of FIGS. 6A to 6G may be omitted.

Figure 7A:
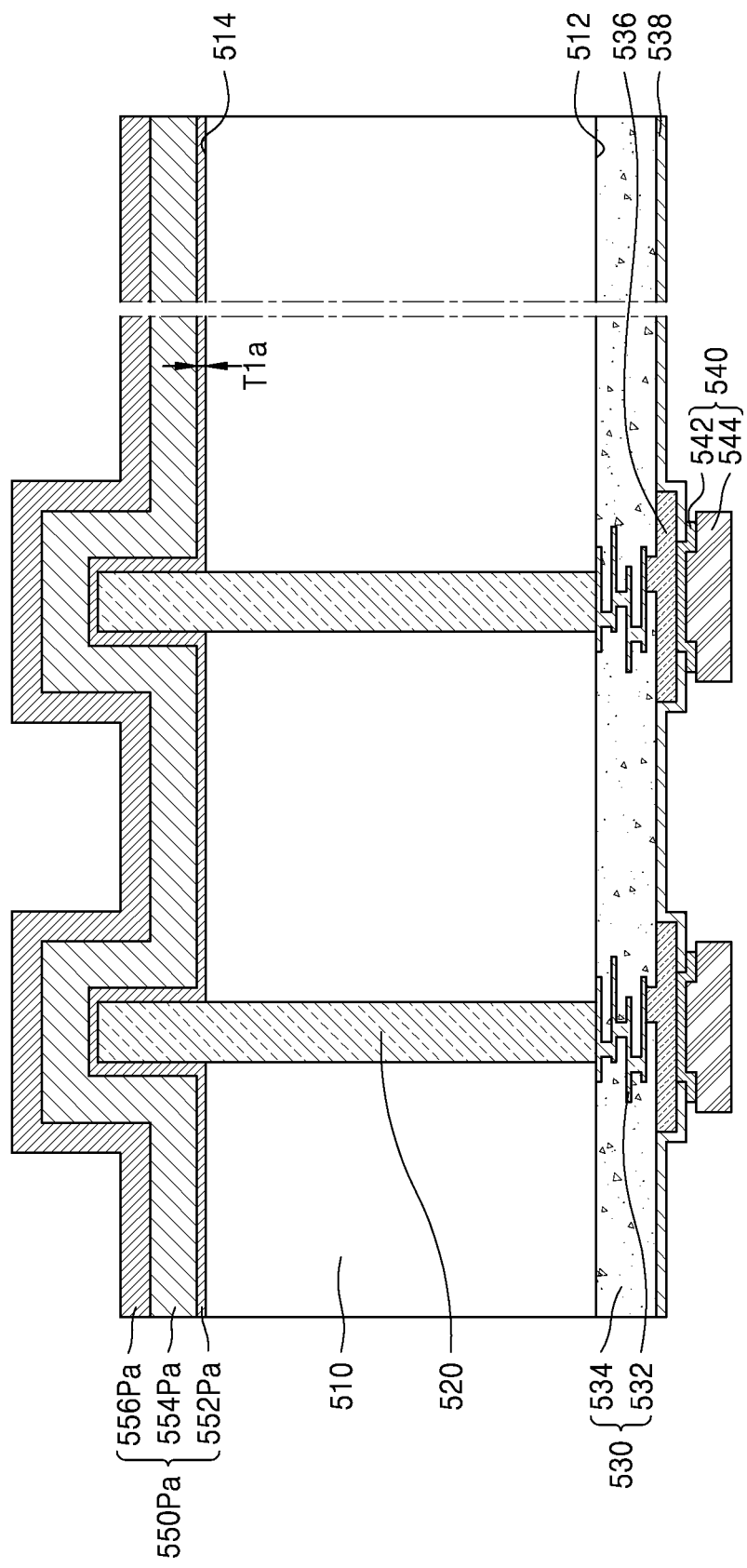
FIGS. 7A to 7D are cross-sectional views illustrating a method of manufacturing an interposer according to an embodiment of the present invention in stages.

Referring to FIG. 7A, on the second surface 514 of the base layer 510, by sequentially forming a preliminary lower interposer 552Pa that conformally covers the second surface 514 of the base layer 510 and the side surfaces and upper surfaces of the plurality of interposer through electrodes 520 protruding outward from the second surface 514 of the base layer 510, a preliminary upper interposer protective layer 554Pa, and a cover interposer protective layer 556Pa, a preliminary interposer protective layer 550Pa may be formed. For example, the preliminary interposer protective layer 550Pa may include the preliminary lower interposer protective layer 552Pa, the preliminary upper interposer protective layer 554Pa, and the cover interposer protective layer 556Pa. The preliminary lower interposer protective layer 552Pa may be formed to have a first thickness T1$a$, and the preliminary upper interposer protective layer 554Pa may be formed to have a thickness greater than the second thickness T2$a$ of FIG. 7B.

Figure 7B:
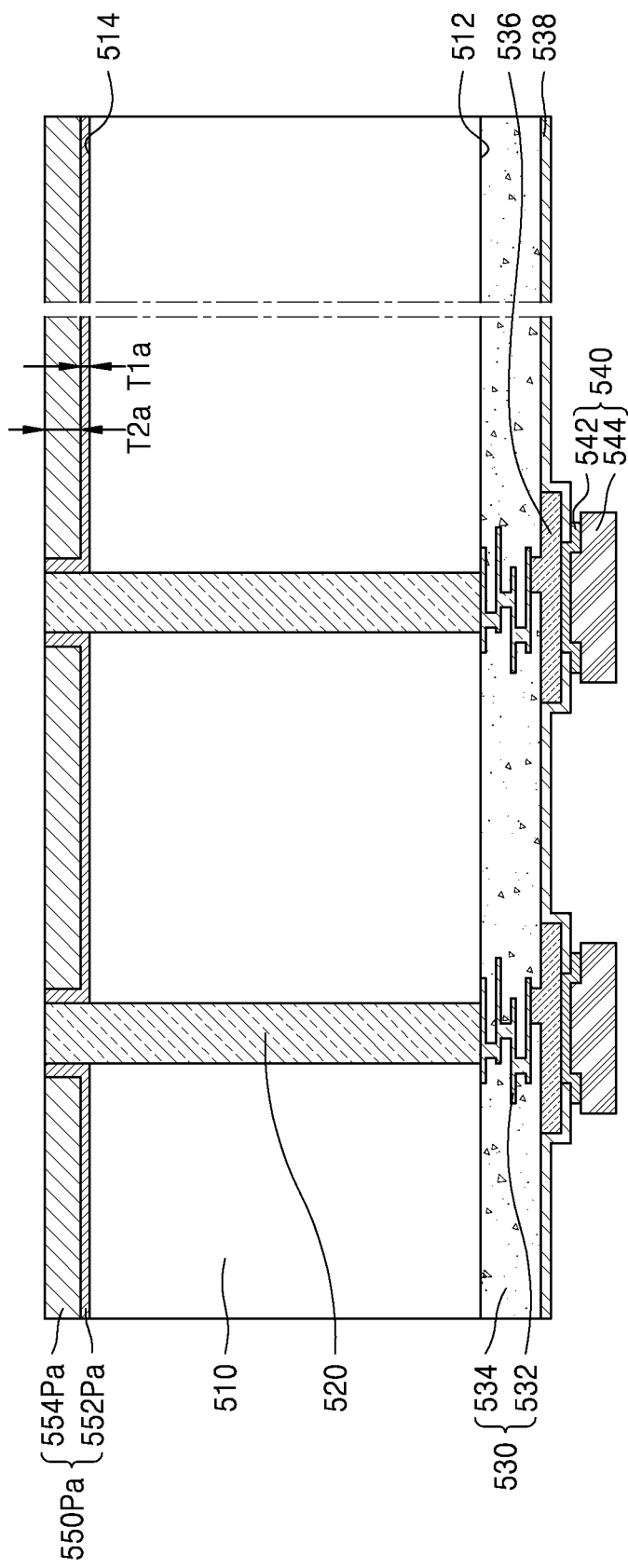

Referring to FIGS. 7A and 7B together, until all of the cover interposer protective layers 556Pa are removed and the thickness of the preliminary upper interposer protective layer 554Pa becomes the second thickness T2$a$, a planarization process is performed in which upper portions of the preliminary interposer protective layer 550Pa and the plurality of interposer through electrodes 520$a$ are removed.

Figure 7C:
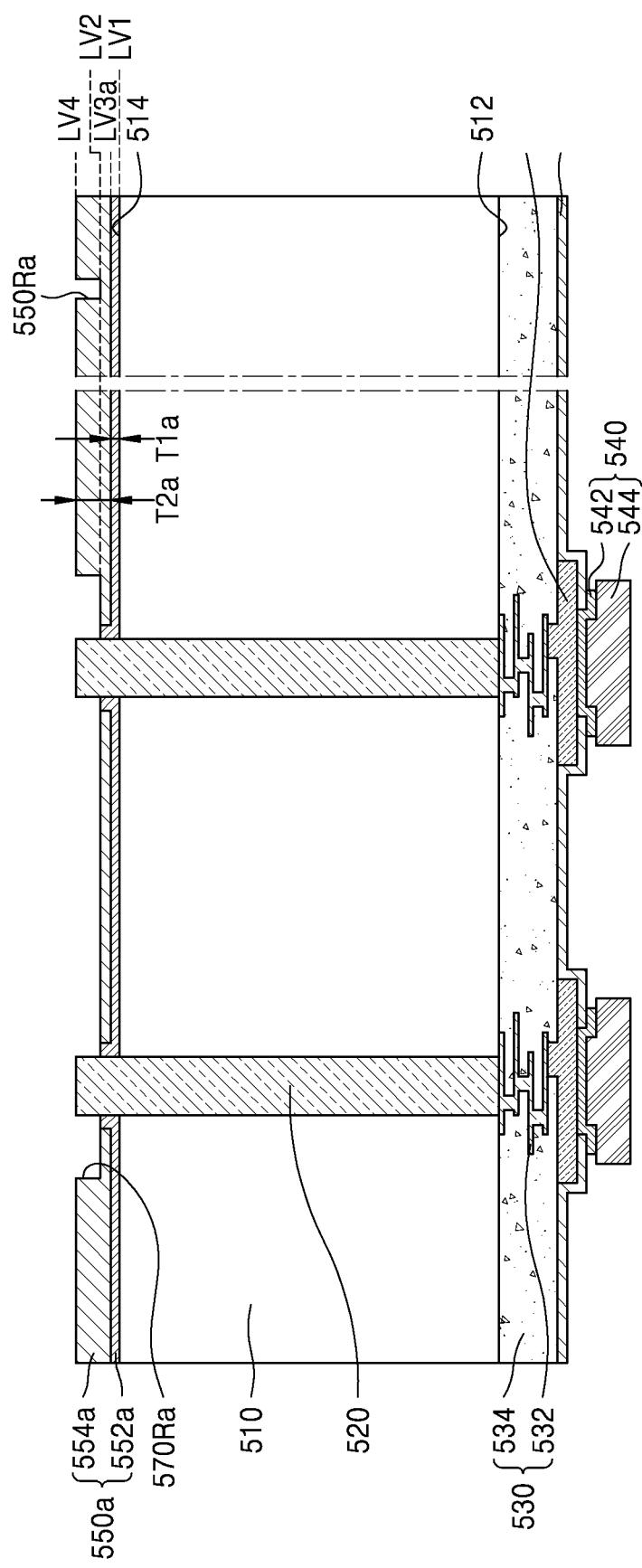

Referring to FIGS. 7B and 7C together, by removing a portion of the preliminary interposer protective layer 550Pa, an interposer protective layer 550$a$ may be formed. For example, the interposer protective layer 550$a$ may include a pad recess 570Ra and an alignment recess 550Ra horizontally spaced apart from each other. The interposer protective layer 550$a$ may include a lower interposer protective layer 552$a$ and an upper interposer protective layer 554$a$. The interposer protective layer 550$a$ may be formed such that a portion of the upper interposer protective layer 554$a$ is exposed on the bottom surface of each of the pad recess 570Ra and the alignment recess 550Ra.

A lower surface of the lower interposer protective layer 552$a$ may be at a first vertical level LV1, and a bottom surface of the pad recess 570Ra may be formed to be positioned at a second vertical level LV2 that is higher than the first vertical level LV1. The upper surface of the lower interposer protective layer 552$a$ and the lower surface of the upper interposer protective layer 554$a$ may contact each other at a third vertical level LV3$a$ that is lower than the second vertical level LV2. An upper surface of each of the upper interposer protective layer 554$a$ and the plurality of interposer through electrodes 520 may be formed to be positioned at a fourth vertical level LV4 that is higher than the second vertical level LV2. For example, top surfaces of the interposer through electrodes 520 and a top surface of the upper interposer protective layer 554$a$ may be formed to be at the same vertical level.

Figure 7D:
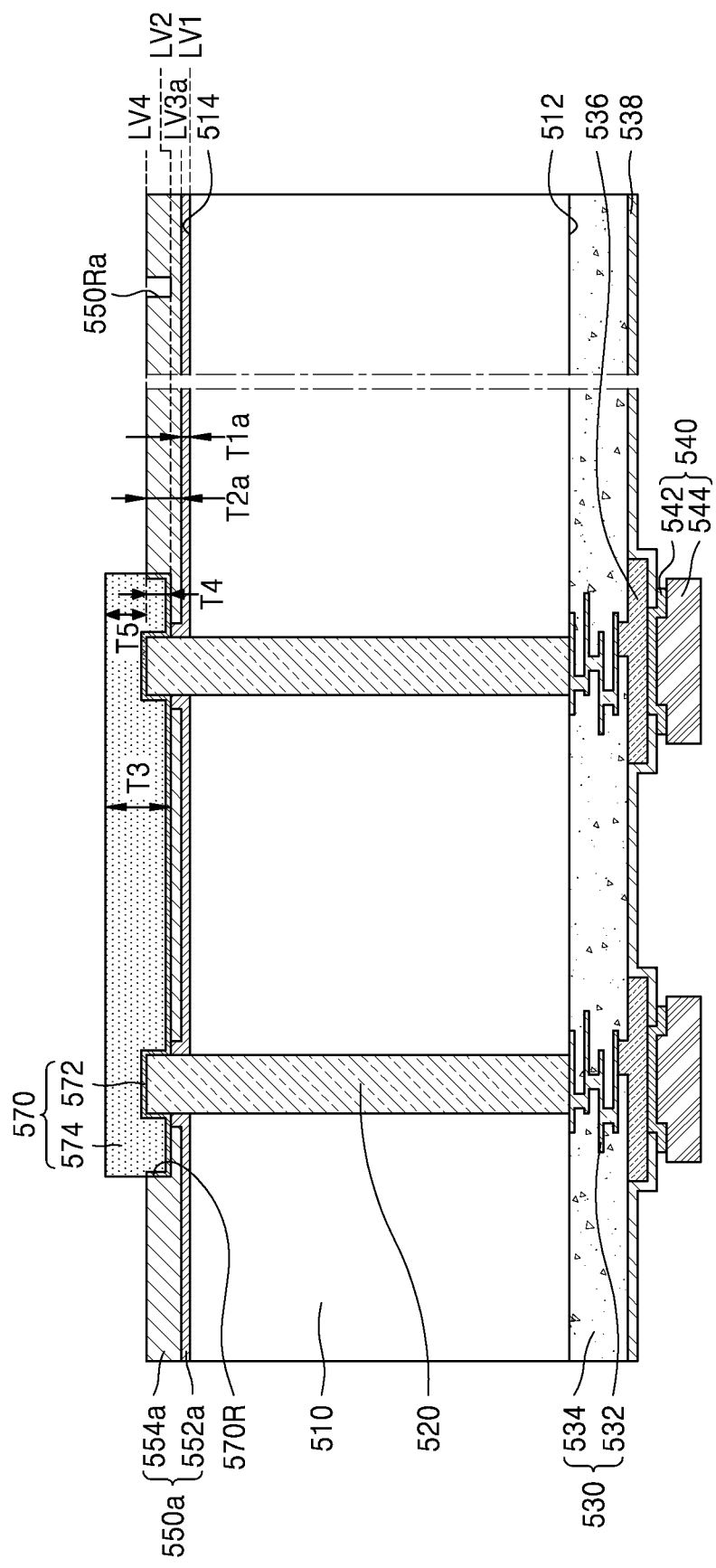

Referring to FIG. 7D, with reference to the description of embodiments illustrated in FIGS. 6D to 6F, an interposer pad 570 including a seed layer 572 and a conductive pad layer 574 is formed.

The interposer pad 570 may be formed to have a third thickness T3 as a maximum thickness, and a portion of the interposer pad 570 below the fourth vertical level LV4, e.g., a portion buried in the interposer protective layer 550$a$, may have a fourth thickness T4, and a portion above the fourth vertical level LV4, e.g., a portion protruding from/above the upper surface of the interposer protective layer 550$a$ without being embedded in the interposer protective layer 550$a$ may have a fifth thickness T5 greater than the fourth thickness T4. In some embodiments, the fifth thickness T5 may be less than the fourth thickness T4.

Thereafter, as shown in FIG. 3, the interposer 500$a$ may be formed by forming the rear wiring protective layer 560 and the interposer connection terminal 580.

The interposer 500$b$ shown in FIG. 4 and the interposer 500$c$ shown in FIG. 5B may be formed by respectively forming the pad recess 570Rb shown in FIG. 4 and the pad recess 570Rc shown in FIG. 4 deeper than the depth of the pad recess 570R of FIG. 2 and the pad recess 570Ra of FIG. 3 described through FIGS. 6A to 7D, so that a detailed description thereof will be omitted.

FIG. 8 is a cross-sectional view illustrating a semiconductor package having an interposer according to an embodiment of the present invention.

Referring to FIG. 8, a semiconductor package 1000 may include a main board 600 on which an interposer 500 is mounted, at least one sub-semiconductor package 10 including a first semiconductor chip 100 and a plurality of second semiconductor chips 200 and attached to the interposer 500, and a third semiconductor chip 400. The at least one sub-semiconductor package 10 and the third semiconductor chip 400 may be mounted on the interposer 500 while being spaced apart from each other in a horizontal direction.

The at least one sub-semiconductor package 10 and the third semiconductor chip 400 may be electrically connected to the interposer 500 by a plurality of micro pads 540. The at least one sub-semiconductor package 10 may have a plurality of first upper surface connection pads 122, and the third semiconductor chip 400 may have a plurality of second upper surface connection pads 420. The plurality of micro pads 540 may be electrically connected to the plurality of first upper surface connection pads 122 and the plurality of second upper surface connection pads 420. In some embodiments, chip connection bumps may be disposed on the plurality of micro pads 540, and the micro pads 540 may be electrically connected to the plurality of first upper surface connection pads 122 and the plurality of second upper surface connection pads 420 through the chip connection bumps interposed therebetween.

The sub-semiconductor package 10 may include a first semiconductor chip 100 and a plurality of second semiconductor chips 200. Although the sub-semiconductor package 10 is illustrated as including four second semiconductor chips 200 in FIG. 8, the present invention is not limited thereto. For example, the sub-semiconductor package 10 may include two or more second semiconductor chips 200. In some embodiments, the sub-semiconductor package 10 may include a multiple of four second semiconductor chips 200. The plurality of second semiconductor chips 200 may be sequentially stacked on the first semiconductor chip 100 in a vertical direction. Each of the first semiconductor chip 100 and the plurality of second semiconductor chips 200 may have an active surface facing downward.

The first semiconductor chip 100 may include a first semiconductor substrate 110 having a first semiconductor device formed on an active surface thereof, a first upper surface connection pad 122 and a first lower surface connection pad 124 respectively disposed on an active surface and an inactive surface of the first semiconductor substrate 110, and a first through electrode 130 penetrating at least a portion of the first semiconductor substrate 110 to electrically connect the first upper surface connection pad 122 and the first lower surface connection pad 124. For example, the inactive surface of the first semiconductor substrate 110 may be a surface opposite the active surface of the first semiconductor substrate 110.

The first semiconductor substrate 110 may include, for example, a semiconductor material such as silicon (Si).

Alternatively, the first semiconductor substrate 110 may include a semiconductor element such as germanium (Ge), or a compound semiconductor such as silicon carbide (SiC), gallium arsenide (GaAs), indium arsenide (InAs), and indium phosphide (InP). The first semiconductor substrate 110 may include a conductive region, for example, a well doped with impurities. The first semiconductor substrate 110 may have various device isolation structures such as a shallow trench isolation (STI) structure.

In this specification, an upper surface and a lower surface of a semiconductor substrate such as the first semiconductor substrate 110 refer to an active surface side and an inactive surface side of the semiconductor substrate, respectively. For example, even when the active surface of the semiconductor substrate is positioned below the inactive surface in the final product, in this specification, the active surface side of the semiconductor substrate is referred to as an upper surface of the semiconductor substrate, and the inactive surface side of the semiconductor substrate is referred to as a lower surface. Also, the terms upper surface and lower surface may be respectively used for each component disposed on the active surface and the component disposed on the inactive surface of the semiconductor substrate.

The first semiconductor device including a plurality of individual devices of various types may be formed on the active surface of the first semiconductor substrate 110.

Each of the second semiconductor chips 200 may include a second semiconductor substrate 210 having a second semiconductor device formed on the active surface, an inner upper surface connection pad 222 and an inner lower surface connection pad 224 respectively disposed on the active and inactive surfaces of the second semiconductor substrate 210, and a second through electrode 230 penetrating at least a portion of the second semiconductor substrate 210 to electrically connect the inner upper surface connection pad 222 and the inner lower surface connection pad 224.

The second semiconductor substrate 210, the inner upper surface connection pad 222, the inner lower surface connection pad 224, and the second through electrode 230 may be substantially the same as the first semiconductor substrate 110, the first upper surface connection pad 122, the first bottom connection pad 124, and the first through electrode 130, respectively, and detailed descriptions thereof will be omitted.

An inner connection terminal 240 may be attached to the inner upper surface connection pad 222 of each of the plurality of second semiconductor chips 200. Inner connection terminals 240 may electrically connect first lower surface connection pads 124 of the first semiconductor chip 100 and inner upper surface connection pads 222 of the plurality of second semiconductor chips 200, and inner lower surface connection pads 224 and inner upper surface connection pads 222 of each of the plurality of second semiconductor chips 200.

In some embodiments, the first semiconductor chip 100 may include a serial-parallel conversion circuit and may be a buffer chip for controlling a DRAM semiconductor chip. In some embodiments, each of the second semiconductor chip 200 may be a DRAM semiconductor chip. The first semiconductor chip 100 may be a master chip, and each of the second semiconductor chips 200 may be a slave chip, and the sub-semiconductor package 10 including the first semiconductor chip 100 and the plurality of second semiconductor chips 200 may be an HBM DRAM.

An insulating adhesive layer 350 may be disposed between each pair of the first semiconductor chip 100 and the plurality of second semiconductor chips 200. The insulating adhesive layer 350 may include a non-conductive film (NCF), a non-conductive paste (NCP), an insulating polymer, or an epoxy resin. The insulating adhesive layer 350 may surround the inner connection terminals 240 and may fill spaces between the first semiconductor chip 100 and the plurality of second semiconductor chips 200, respectively.

In some embodiments, among the plurality of second semiconductor chips 200, the second semiconductor chip 200 disposed at the uppermost position farthest from the first semiconductor chip 100 may not include the inner lower surface connection pad 224 and the second through electrode 230. In some embodiments, among the plurality of second semiconductor chips 200, the thickness of the second semiconductor chip 200 positioned at the uppermost position farthest from the first semiconductor chip 100 may be greater than the thicknesses of the remaining second semiconductor chips 200.

The width and area of the first semiconductor chip 100 may be greater than the width and area of each of the plurality of second semiconductor chips 200. The sub-semiconductor package 10 may further include a molding layer 300 surrounding the side surfaces of the plurality of second semiconductor chips 200 and the side surfaces of the insulating adhesive layer 350 on the first semiconductor chip 100. The molding layer 300 may include and/or be formed of, for example, an epoxy mold compound (EMC).

The third semiconductor chip 400 may include a third semiconductor substrate 410 and a second upper surface connection pad 420. The third semiconductor substrate 410 and the second upper surface connection pad 420 may be components substantially the same as or similar to the first semiconductor substrate 110 and the first upper surface connection pad 122, respectively, or may be components substantially the same or similar to the second semiconductor substrate 120 and the inner upper surface connection pad 222, respectively, so that a detailed description thereof will be omitted.

The third semiconductor chip 400 may be, for example, a central processing unit (CPU) chip, a graphics processing unit (GPU) chip, or an application processor (AP) chip.

The interposer 500 may include a base layer 510, a plurality of interposer through electrodes 520, a wiring structure 530, a plurality of micro pads 540, an interposer protective layer 550, a plurality of interposer pads 570, and a rear wiring protective layer 560.

In some embodiments, the semiconductor package 1000 may include any one of the interposers 500a, 500b, and 500c described with reference to FIGS. 3 to 5 instead of the interposer 500. The interposers 500, 500a, 500b, and 500c have been described in detail with reference to FIGS. 1 to 7D, and overlapping descriptions will be omitted.

A first underfill layer 380 may be disposed between the sub-semiconductor package 10 and the interposer 500, and a second underfill layer 480 may be disposed between the third semiconductor chip 400 and the interposer 500.

The semiconductor package 1000 may further include a package molding layer 900 surrounding the sub semiconductor package 10 and the side surfaces of the third semiconductor chip 400 on the interposer 500. The package molding layer 900 may include and/or be formed of, for example, an EMC.

In some embodiments, the package molding layer 900 may cover the upper surface of the interposer 500 and side surfaces of each of the sub-semiconductor package 10 and the third semiconductor chip 400, but may not cover the upper surfaces of the sub-semiconductor package 10 and the third semiconductor chip 400, and the semiconductor package 1000 may further include a heat dissipation member covering upper surfaces of the sub-semiconductor package 10 and the third semiconductor chip 400. The heat dissipation member may include a heat dissipation plate such as a heat slug or a heat sink. In some embodiments, the heat dissipation member may surround the sub-semiconductor package 10, the third semiconductor chip 400, and the interposer 500 on the upper surface of the package base substrate 600. For example, the heat dissipation member may vertically overlap the whole bodies of sub-semiconductor package 10, the third semiconductor chip 400, and the interposer 500.

A plurality of interposer connection terminals 580 may be attached to the plurality of interposer pads 570. The plurality of interposer connection terminals 580 may electrically connect the interposer 500 and the package base substrate 600.

The package base substrate 600 may include a base board layer 610, a board upper surface pad 622 and a board lower surface pad 624 respectively disposed on the upper surface and the lower surface of the base board layer 610, and a board wiring layer 630 that electrically connects the board upper surface pad 622 and the board lower surface pad 624 in the base board layer 610. In some embodiments, the package base board 600 may be a printed circuit board. For example, the package base board 600 may be a multi-layer printed circuit board. The base board layer 610 may be made of at least one material selected from phenol resin, epoxy resin, and polyimide.

A solder resist layer (not shown) exposing the board upper surface pad 622 and the board lower surface pad 624 may be formed on each of the upper and lower surfaces of the base board layer 610. The interposer connection terminal 580 may be electrically connected to and/or contact the board lower surface pad 624, and the package connection terminal 650 may be electrically connected to and/or contact the board upper pad 622 on the bottom of the board. The interposer connection terminal 540 may electrically connect the plurality of pad wiring layers 524 and the board upper surface pad 622. The package connection terminal 650 electrically connected to and/or contact the board upper surface pad 622 may electrically connect the semiconductor package 1000 to the outside.

Since the semiconductor package 1000 according to an embodiment of the present invention includes the interposer 500 that may prevent a warpage phenomenon from occurring, electrical connection reliability between the sub-semiconductor package 10, the third semiconductor chip 400 and the interposer 500 may be improved, so that operation reliability of the semiconductor package 1000 may be improved.

While the inventive concept has been particularly shown and described with reference to embodiments thereof, it will be understood that various changes in form and details may be made therein without departing from the spirit and scope of the following claims.

What is claimed is:

1. An interposer comprising:
a base layer having opposite first and second surfaces;
a wiring structure on the first surface of the base layer;
an interposer protective layer disposed on the second surface of the base layer and having a pad recess with a lower surface of the interposer protective layer at a first vertical level and a bottom surface of the pad recess at a second vertical level that is higher than the first vertical level, the interposer protective layer comprising a lower interposer protective layer covering the second surface of the base layer; and an upper interposer protective layer formed of a material that is different from that of the lower interposer protective layer and has a lower surface in contact with the lower interposer protective layer at a third vertical level and an upper surface positioned at a fourth vertical level that is higher than the third vertical level;
an interposer pad of which a portion fills the pad recess of the interposer protective layer and the remaining portion protrudes from the upper surface of the upper interposer protective layer; and
an interposer through electrode extending through the base layer and the interposer protective layer to the interposer pad, the interposer through electrode electrically connecting the wiring structure to the interposer pad.

2. The interposer of claim 1, wherein the interposer protective layer has an alignment recess constituting an alignment key, the alignment recess having a bottom surface positioned at the second vertical level.

3. The interposer of claim 1, wherein the third vertical level is between the second vertical level and the fourth vertical level.

4. The interposer of claim 1, wherein the third vertical level is between the first vertical level and the second vertical level.

5. The interposer of claim 1, wherein the interposer through electrode extends into the interposer pad up to the fourth vertical level.

6. The interposer of claim 1, wherein, in the interposer pad, a thickness of a portion of the interposer the pad recess is less than a thickness of the remaining portion protruding from the interposer protective layer.

7. The interposer of claim 1, wherein, in the interposer pad, a thickness of a portion of the interposer pad filling the pad recess of the interposer protective layer is greater than a thickness of the portion protruding from the interposer protective layer.

8. The interposer of claim 1, wherein a lower surface of the interposer pad contacts the interposer through electrode and the lower interposer protective layer without contacting the upper surface of the upper interposer protective layer.

9. The interposer of claim 1, wherein a lower surface of the interposer pad contacts the interposer through electrode, the upper interposer protective layer, and the lower interposer protective layer.

10. A semiconductor package comprising:
the interposer of claim 1, wherein the interposer further comprises a plurality of micro-pads electrically connected to the wiring structure;
at least one sub-semiconductor package mounted on the first surface of the base layer electrically connected to some of the plurality of micro-pads, and including a first semiconductor chip and a plurality of second semiconductor chips sequentially stacked; and
a third semiconductor chip spaced apart from the at least one sub-semiconductor package in a horizontal direction and mounted on the first surface of the base layer electrically connected to some other ones of the plurality of micro-pads.

11. The semiconductor package of claim 10, wherein the interposer protective layer has an alignment recess including a bottom surface at the same vertical level as a lower surface of the interposer pad, the alignment recess being a part of an alignment key.

12. The semiconductor package of claim 10, wherein the plurality of second semiconductor chips comprise dynamic random-access memory (DRAM) semiconductor chips, and the first semiconductor chip comprises a buffer chip configured to control the DRAM semiconductor chips.

13. The semiconductor package of claim 10, wherein the third semiconductor chip comprise a central processing unit (CPU) chip, a graphics processing unit (GPU) chip, or an application processor (AP) chip.

14. The semiconductor package of claim 10, wherein a thickness of a portion of the interposer pad protruding from the interposer protective layer is greater than a thickness of a portion of the interposer pad not protruding from the interposer protective layer, but has a value of 4 μm or less.

15. An interposer comprising:
a base layer having opposite first and second surfaces;
a wiring structure on the first surface of the base layer;
a lower interposer protective layer formed on the second surface of the base layer;
an upper interposer protective layer formed on the lower interposer protective layer;
an interposer pad of which a first portion filling a pad recess extending and which extends from an upper surface of the upper interposer protective layer into the lower interposer protective layer and a second portion protruding from the upper interposer protective layer are integrally formed;
an interposer through electrode extending through the base layer and the lower interposer protective layer to the interposer pad up to the same vertical level as an upper surface of the upper interposer protective layer, the interposer through electrode electrically connecting the wiring structure to the interposer pad; and
an alignment key penetrating the upper interposer protective layer and extending into the lower interposer protective layer.

16. The interposer of claim 15, wherein a maximum thickness of the lower interposer protective layer is greater than a maximum thickness of the upper interposer protective layer.

17. The interposer of claim 15, wherein a maximum thickness of the lower interposer protective layer is less than a maximum thickness of the upper interposer protective layer.

18. The interposer of claim 15, wherein a thickness of the second portion of the interposer pad is greater than a thickness of the first portion of the interposer pad.

19. The interposer of claim 15, wherein a bottom surface of the pad recess and a bottom of the alignment key are at the same vertical level.

20. An interposer comprising:
a base layer having opposite first and second surfaces;
a wiring structure on the first surface of the base layer;
an interposer protective layer disposed on the second surface of the base layer and having a pad recess and an alignment recess constituting an alignment key, with a lower surface of the interposer protective layer at a first vertical level and a bottom surface of the pad recess at a second vertical level that is higher than the first vertical level and the alignment recess having a bottom surface positioned at the second vertical level;
an interposer pad of which a portion fills the pad recess of the interposer protective layer and the remaining portion protrudes from the interposer protective layer; and
an interposer through electrode extending through the base layer and the interposer protective layer to the interposer pad, the interposer through electrode electrically connecting the wiring structure to the interposer pad.

* * * * *